United States Patent
Yeo et al.

(10) Patent No.: US 9,229,283 B2
(45) Date of Patent: Jan. 5, 2016

(54) DISPLAY SUBSTRATE INCLUDING ORGANIC LAYER AND METHOD OF MANUFACTURING THE SAME

(75) Inventors: Yun-Jong Yeo, Seoul (KR); Yu-Gwang Jeong, Jeollanam-do (KR); Hong-Kee Chin, Suwon-si (KR); Sang-Gab Kim, Seoul (KR); Jeong-Min Park, Seoul (KR); Ji-Young Park, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 175 days.

(21) Appl. No.: 13/488,733

(22) Filed: Jun. 5, 2012

(65) Prior Publication Data

US 2013/0146900 A1 Jun. 13, 2013

(30) Foreign Application Priority Data

Dec. 12, 2011 (KR) ........................ 10-2011-0132525

(51) Int. Cl.
*H01L 27/00* (2006.01)
*G02F 1/1343* (2006.01)
*H01L 27/12* (2006.01)

(52) U.S. Cl.
CPC ...... *G02F 1/134363* (2013.01); *H01L 27/1248* (2013.01); *H01L 27/1288* (2013.01); *H01L 27/124* (2013.01); *H01L 27/1244* (2013.01)

(58) Field of Classification Search
CPC .............. H01L 27/124; H01L 27/1244; H01L 27/1248; H01L 33/62; G02F 1/134363
See application file for complete search history.

(56) References Cited

U.S. PATENT DOCUMENTS

| | | | |
|---|---|---|---|
| 6,774,965 B2 | 8/2004 | Nakashima et al. | |
| 7,271,867 B2* | 9/2007 | Kim et al. | 349/138 |
| 7,872,721 B2 | 1/2011 | Oh et al. | |
| 2002/0054263 A1* | 5/2002 | Kim et al. | 349/123 |
| 2006/0139733 A1* | 6/2006 | Lee et al. | 359/296 |

FOREIGN PATENT DOCUMENTS

KR 0646787 11/2006

* cited by examiner

*Primary Examiner* — Caleb Henry
*Assistant Examiner* — Alexander Belousov
(74) *Attorney, Agent, or Firm* — Cantor Colburn LLP

(57) ABSTRACT

A display substrate includes a base substrate, a switching element, a protecting layer, an organic layer, a first pixel electrode and a second pixel electrode. The switching element is on the base substrate, and includes a gate electrode, a source electrode and a drain electrode. The protecting layer is on the switching element, and includes a first hole exposing the drain electrode. The organic layer is on the protecting layer, and includes a second hole which exposes a side surface of the protecting layer which defines the first hole and exposes a top surface of the protecting layer which is adjacent to the side surface of the protecting layer. The first pixel electrode is on the organic layer. The second pixel electrode overlaps the first pixel electrode, and is electrically connected to the drain electrode via the first and second holes.

8 Claims, 20 Drawing Sheets

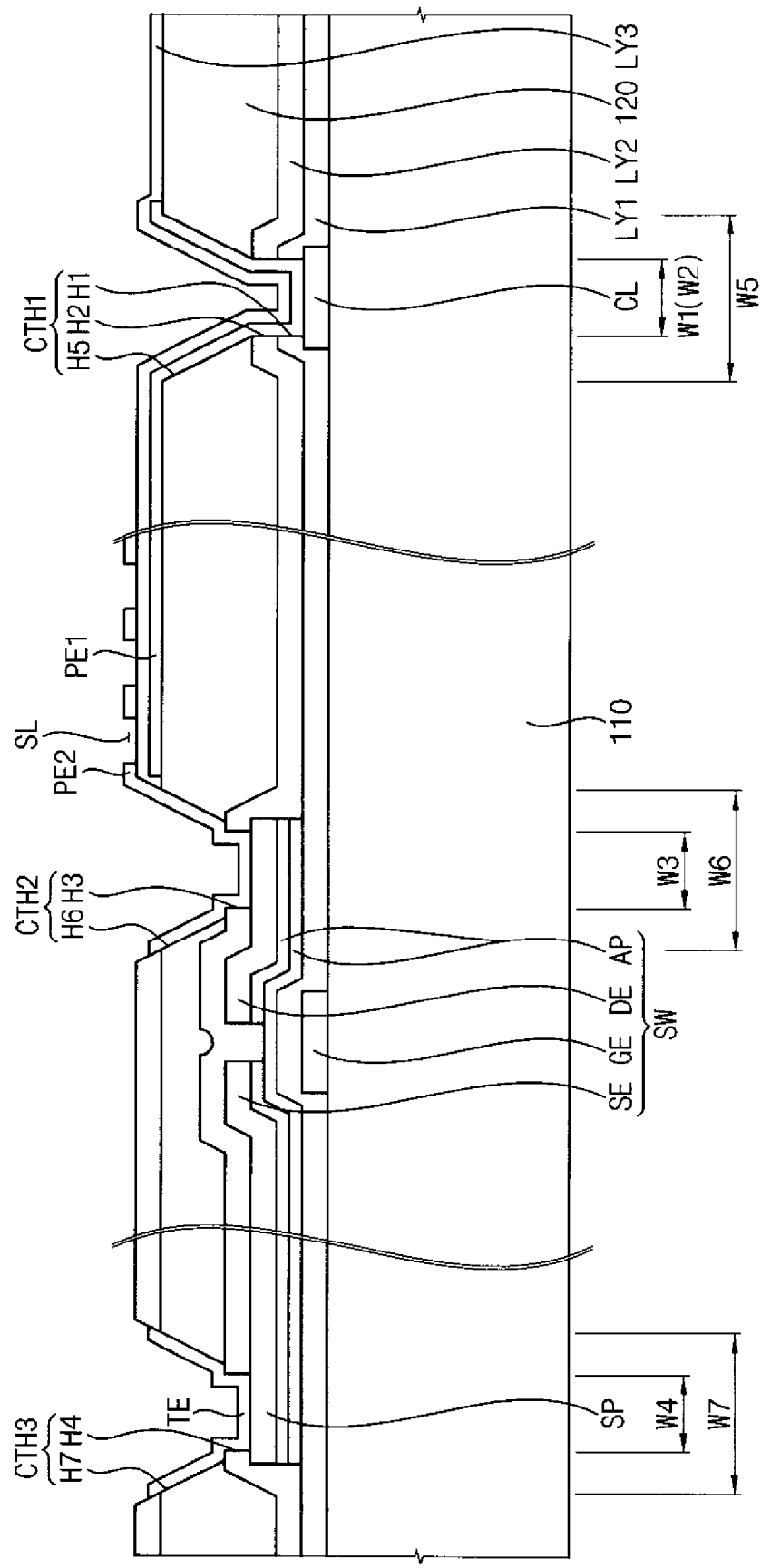

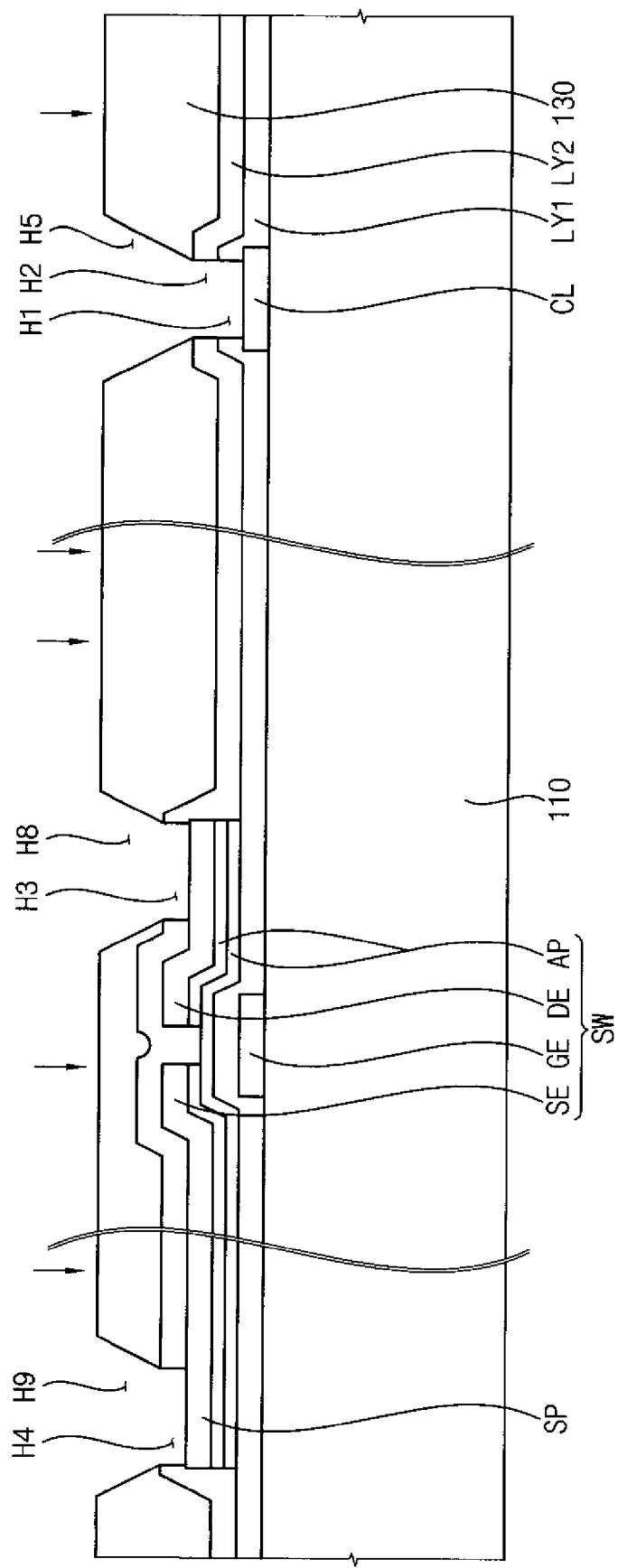

DISPLAY SUBSTRATE INCLUDING ORGANIC LAYER AND METHOD OF MANUFACTURING THE SAME

This application claims priority to Korean Patent Application No. 10-2011-0132525, filed on Dec. 12, 2011, and all the benefits accruing therefrom under 35 U.S.C. §119, the contents of which are incorporated by reference herein in its entirety.

BACKGROUND OF THE INVENTION

1. Field of the Invention

Exemplary embodiments of the invention relate to a display substrate and a method of manufacturing the display substrate. More particularly, exemplary embodiments of the invention relate to a display substrate including an organic layer and a method of manufacturing the display substrate.

2. Description of the Related Art

Generally, a display device includes a first display substrate, a second display substrate opposite to the first display substrate, and a liquid crystal layer disposed between the first display substrate and the second display substrate.

The first display substrate includes a gate line, a data line, a switching element connected to the gate line and the data line, a gate insulating layer disposed on a gate electrode of the switching element, a protecting layer disposed on source and drain electrodes of the switching element and partially exposing the drain electrode, and a pixel electrode electrically connected to the switching element.

The pixel electrode is formed over the gate line or the data line. The pixel electrode may overlap with the gate line or the data line, or be spaced apart from the gate line or the data line. Thus, the parasitic capacitance between the pixel electrode and the gate line or the data line may be generated.

The first display substrate may further an organic layer increasing a distance between the pixel electrode and the gate line or the data line, so that the parasitic capacitance between the pixel electrode and the gate line or the data line may be reduced.

In this case, when the organic layer, and the protecting layer under the organic layer are patterned to form a contact hole, an under-cut may be generated. Thus, the pixel electrode formed along the contact hole may be disconnected, so that the reliability of the display device may be reduced.

However, when the organic layer is subject to an ashing process to remove the under-cut, a processing time may increase, and a surface of the organic layer may be rough. Thus, the pixel electrode formed on the organic layer may be disconnected, so that the display device may generate persistence of vision.

In addition, when the first display substrate further include the organic layer, a number of masks increases, so that the manufacturing cost of the display device may increase.

BRIEF SUMMARY OF THE INVENTION

One or more exemplary embodiments of the invention provide a display substrate capable of improving a display device.

One or more exemplary embodiments of the invention also provide a method of manufacturing the display substrate.

According to an exemplary embodiment of the invention, a display substrate includes a base substrate, a switching element, a protecting layer, an organic layer, a first pixel electrode and a second pixel electrode. The switching element is disposed on the base substrate, and includes a gate electrode, a source electrode and a drain electrode. The protecting layer is disposed on the switching element, and includes a first hole exposing the drain electrode. The organic layer is disposed on the protecting layer, and includes a second hole exposing a side surface of the protecting layer defining the first hole and exposing a top surface of the protecting layer adjacent to the side surface of the protecting layer. The first pixel electrode is disposed on the organic layer. The second pixel electrode is disposed over the first pixel electrode, and is electrically connected to the drain electrode via the first and second holes.

In an exemplary embodiment, the display substrate may further include a data line extended from the source electrode and a signal pad extended from the data line. The protecting layer may be disposed on the signal pad, and include a third hole exposing the signal pad. The organic layer may include a fourth hole exposing a side surface of the protecting layer defining the third hole and a top surface of the protecting layer adjacent to the side surface of the protecting layer defining the third hole.

In an exemplary embodiment, the display substrate may further include a common line and an insulating layer. The common line may include a substantially same material as the gate electrode. The insulating layer may be disposed on the common line, and include a fifth hole exposing the common line. The protecting layer may be disposed on the insulating layer, and include a sixth hole overlapping with the fifth hole. The organic layer may cover a side surface of the insulating layer defining the fifth hole and a side surface of the protecting layer defining the sixth hole, and include a seventh hole exposing the common line.

According to another exemplary embodiment of the invention, a display substrate includes a base substrate, a switching element, a protecting layer, an organic layer, a first pixel electrode and a second pixel electrode. The switching element is disposed on the base substrate, and includes a gate electrode, a source electrode and a drain electrode. The protecting layer is disposed on the switching element, and includes a first hole exposing the drain electrode. The organic layer is disposed on the protecting layer, covers a side surface of the protecting layer and includes a second hole exposing the drain electrode. The first pixel electrode is disposed on the organic layer. The second pixel electrode is disposed over the first pixel electrode, and is electrically connected to the drain electrode via the first and second holes.

In an exemplary embodiment, the display substrate may further include a data line extended from the source electrode and a signal pad extended from the data line. The protecting layer may be disposed on the signal pad, and include a third hole exposing the signal pad. The organic layer may cover the side surface of the protecting layer defining the third hole, and include a fourth hole exposing the signal pad.

According to still another exemplary embodiment of the invention, a method of manufacturing a display substrate is provided. In the method, a first pixel electrode is formed on the base substrate on which a switching element, a signal pad and a common line are formed. The first pixel electrode is connected to the common line. The switching element includes a gate electrode, a source electrode and a drain electrode. The signal pad includes a substantially same material as the drain electrode. The common line includes a substantially same material as the gate electrode. A pixel insulating layer and a first photoresist layer are sequentially formed on the base substrate on which the first pixel electrode is formed. The pixel insulating layer and the first photoresist layer are patterned to expose the drain electrode and the signal pad, and to form a photo pattern. A transparent electrode layer and a second photoresist layer are sequentially formed on the photo pattern. The second photoresist layer is partially removed to expose the transparent electrode layer. The exposed transparent electrode layer is etched to form a second pixel electrode and a transparent electrode, the second pixel electrode connected to the drain electrode, the transparent electrode connected to the signal pad.

In an exemplary embodiment, in the method, a gate insulating layer may be formed on the base substrate on which the gate electrode and the common line are formed. The source and drain electrodes and the signal pad may be formed on the gate insulating layer. A protecting layer and an organic layer may be sequentially formed on the base substrate on which the source and drain electrodes and the signal pad are formed. The protecting layer and the organic layer may be patterned to expose the drain electrode and the signal pad, and the gate insulating layer, the protecting layer and the organic layer may be patterned to expose the common line.

In an exemplary embodiment, when the drain electrode, the signal pad and the common line are exposed, the organic layer may be patterned to form first, second and third holes exposing the protecting layer overlapping with the common line, the signal pad and the drain electrode. The exposed protecting layer may be removed to form fourth, fifth and sixth holes exposing the gate insulating layer overlapping with the common line, the drain electrode and the signal pad. The exposed gate insulating layer may be removed to form a seventh hole exposing the common line.

In an exemplary embodiment, when the photo pattern is formed, the first photoresist layer may be patterned to form a first photo pattern. The first photo pattern may expose the pixel insulating layer overlapping with the drain electrode and the signal pad, and have a first thickness and a second thickness larger than the first thickness. The exposed pixel insulating layer may be removed to expose the drain electrode and the signal pad, and the first photo pattern having the first thickness may be removed to form a second photo pattern.

In an exemplary embodiment, when the second photo pattern is formed, side surfaces of the organic layer forming the second and third holes may be exposed. The side surface of the organic layer forming the second and third holes may be removed to form eighth and ninth holes exposing top surfaces of the protecting layer adjacent to side surfaces of the protecting layer.

In an exemplary embodiment, when the drain electrode, the signal pad and the common line are exposed, the organic layer may be patterned to form first, second and third holes exposing the protecting layer overlapping with the common line, the drain electrode and the signal pad. The exposed protecting layer may be removed to form fourth, fifth and sixth exposing the gate insulating layer overlapping with the common line, the drain electrode and the signal pad. The patterned organic layer may be baked at a first temperature. The organic layer may cover sides of the protecting layer forming the fourth, fifth and sixth holes.

In an exemplary embodiment, in the method, the patterned organic layer may be baked at a second temperature different from the first temperature, before forming the fourth, fifth and sixth holes.

In an exemplary embodiment, the first temperature may be about 200° C. to about 500° C., and the second temperature may be about 100° C. to about 200° C.

In an exemplary embodiment, when the photo pattern is formed, the first photoresist layer may be patterned to form a first photo pattern. The first photo pattern may expose the pixel insulating layer overlapping with the drain electrode and the signal pad. The first photo pattern may have a first thickness and a second thickness larger than the first thickness. The exposed pixel insulating layer may be removed to expose the drain electrode and the signal pad, and the first photo pattern having the first thickness may be removed to form a second photo pattern.

In an exemplary embodiment, when the second photo pattern is formed, side surfaces of the organic layer forming the second and third holes may be exposed. The side surfaces of the organic layer forming the second and third holes may be removed to expose top surfaces of the protecting layer adjacent to side surfaces of the protecting layer forming the fifth and sixth holes.

According to still another exemplary embodiment of the invention, a method of manufacturing a display substrate is provided. In the method, a protecting layer and an organic layer are sequentially formed on a base substrate on which a switching element, a signal pad and a common line are formed. The protecting layer and the organic layer cover the switching element, the signal pad and the common line. The switching element includes a gate electrode, a source electrode and a drain electrode. The signal pad includes a substantially same material as the drain electrode. The common line includes a substantially same material as the gate electrode. The organic layer is patterned to form first, second and third holes exposing the protecting layer overlapping with the common line, the drain electrode and the signal pad. The exposed protecting layer is removed to form fourth, fifth and sixth holes exposing a gate insulating layer overlapping with the common line, the drain electrode and the signal pad. The patterned organic layer is baked at a first temperature, so that the organic layer covers side surfaces of the protecting layer forming the fourth, fifth and sixth holes. A first pixel electrode connected to the common line is formed. A second pixel electrode and a transparent electrode are formed over the first pixel electrode. The second pixel electrode and the transparent electrode are connected to the drain electrode and the signal pad, respectively.

In an exemplary embodiment, in the method, the patterned organic layer may be baked at a second temperature lower than the first temperature, before forming the fourth, fifth and sixth holes.

In an exemplary embodiment, the first temperature may be about 200° C. to about 500° C., and the second temperature may be about 100° C. to about 200° C.

According to one or more exemplary embodiments of a display substrate and a method of manufacturing the same, a second pixel electrode formed over the first pixel electrode is patterned using a pixel insulating layer which is itself patterned using a mask and a photo pattern on the pixel protecting layer, so that the number of masks required in manufacturing process of the display substrate may be reduced.

In addition, a side surface of an organic layer forming a contact hole is removed when the photo pattern is ashed, so that under-cut of the contact hole may be reduced or effectively prevented. Thus, disconnection of the second pixel electrode may be reduced or effectively prevented.

In addition, the organic layer is baked after the organic layer and a protecting layer or a gate insulating layer under the organic layer are patterned, so that the under-cut of the contact hole may be removed. Thus, disconnection of the second pixel electrode may be reduced or effectively prevented.

Therefore, the reliability of a display substrate may be improved.

BRIEF DESCRIPTION OF THE DRAWINGS

The above and other features and advantages of the invention will become more apparent by describing in detailed exemplary embodiments thereof with reference to the accompanying drawings, in which:

FIG. 2 is a cross-sectional view illustrating the display substrate taken along line I-I' of FIG. 1;

FIGS. 5A to 5H are cross-sectional views illustrating an exemplary embodiment of a method of manufacturing the display substrate of FIG. 4;

DETAILED DESCRIPTION OF THE INVENTION

Figure 1:
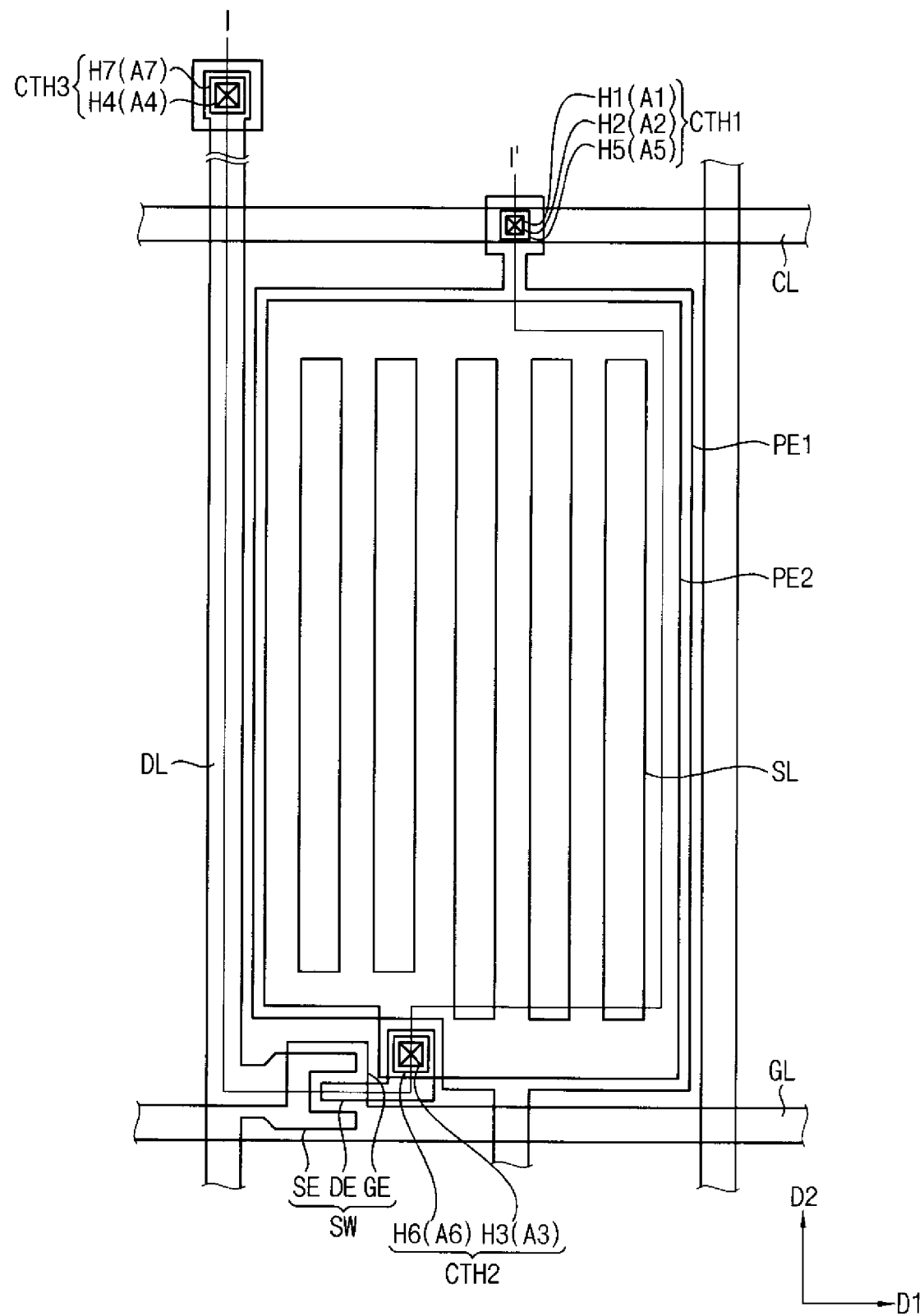
FIG. 1 is a plan view illustrating an exemplary embodiment of a display substrate according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a plan view illustrating an exemplary embodiment of a display substrate according to the invention. FIG. 2 is a cross-sectional view illustrating the display substrate taken along line I-I' of FIG. 1.

Referring to FIG. 1 and FIG. 2, the exemplary embodiment of a display substrate includes a base substrate 110, a gate line GL, a data line DL, a switching element SW, a signal pad SP, a common line CL, a first pixel electrode PE1, a second pixel electrode PE2, a gate insulating layer LY1, a protecting layer LY2, an organic layer 120 and a pixel insulating layer LY3, which are disposed on the base substrate 110.

The gate line GL is disposed on the base substrate 110 and has a longitudinal axis which extends in a first direction D1. The data line DL has a longitudinal axis which extends in a second direction D2 crossing the first direction D1. The gate line GL is insulated from the data line DL by the gate insulating layer LY1.

The switching element SW includes a gate electrode GE continuous with and extended from the gate line GL, a source electrode SE continuous with and extended from the data line DL, and a drain electrode DE disposed overlapping the gate electrode GE and spaced apart form the source electrode SE. The switching element SW may further include an active pattern AP disposed between the gate electrode GE and the source electrode SE and between the gate electrode GE and the drain electrode DE.

The signal pad SP is continuous with and extended from an end of the data line DL. The signal pad SP is electrically and/or physically connected to an external device (for example, a source driver) and provides a data signal to the data line DL.

The common line CL may have a longitudinal axis which extends in the first direction D1. The common line CL may include a substantially same material as the gate line GL. The common line CL may receive a common voltage from the external device.

The first pixel electrode PE1 is disposed adjacent to the switching element SW in the plan view. The second pixel electrode PE2 is disposed above the first pixel electrode PE1 with respect to the base substrate 110, and overlaps with the first pixel electrode PE1. The first pixel electrode PE1 is insulated from the second pixel electrode PE2 by the pixel insulating layer LY3.

The first pixel electrode PE1 is physically and/or electrically connected to the common line CL through a first contact hole CTH1. Thus, the first pixel electrode PE1 may receive the common voltage from the common line CL.

The second pixel electrode PE2 may have a longitudinal axis which extends parallel with the longitudinal axis of the data line DL. The second pixel electrode PE2 is physically and/or electrically connected to the drain electrode DE through a second contact hole CTH2. Thus, the second pixel electrode PE2 may receive the data voltage from the data line DL.

A portion of the first pixel electrode PE1 overlaps with one single, unitary, indivisible second pixel electrode PE2, so that one pixel part may be defined.

The second pixel electrode PE2 includes a plurality of slits SL. The slits SL have longitudinal axes which are parallel with the longitudinal axis of the data line DL. Thus, horizontal electrical fields between the first pixel electrode PE1 and the second pixel electrode PE2 may be formed by the slits SL.

The display substrate may further include a transparent electrode TE physically and/or electrically connected to the signal pad SP through a third contact hole CTH3. The transparent electrode TE may increase a contacting area between the signal pad SP and the external device. The transparent electrode TE may extend along inner walls of the third contact hole CTH3 and onto inner walls of the organic layer 120 at the third contact hole CTH3.

The gate insulating layer LY1 is disposed between a gate pattern including the gate line GL, the gate electrode GE and the common line CL, and a data pattern including the data line DL, the source and drain electrodes SE and DE and the signal pad SP.

The gate insulating layer LY1 includes a first hole H1 partially exposing the common line CL. The first hole H1 may have a first area A1 in a plan view. The first hole H1 may have a first width W1 in a cross-sectional view. The widths W of the holes H may be the maximum dimension in the cross-sectional view, or may be a dimension at a particular point along a thickness which is taken perpendicular to the base substrate 110, of the respective layer including the hole H.

The protecting layer LY2 is disposed on the data pattern, and the organic layer 120 is disposed on the protecting layer LY2. In one exemplary embodiment, for example, the protecting layer LY2 and the organic layer 120 are disposed between the data pattern and the first pixel electrode PE1.

The protecting layer LY2 may include silicon nitride (SiNx). The protecting layer LY2 may protect the data pattern.

The protecting layer LY2 includes a second hole H2 exposing the common line CL exposed by the first hole H1. The second hole H2 overlaps and is aligned with the first hole H1. The second hole H2 may have a second area A2 substantially same as the first area A1 in a plan view. The second hole H2 may have a second width W2 substantially same as the first width W1 in a cross-sectional view.

In addition, the protecting layer LY2 includes a third hole H3 partially exposing the drain electrode DE. The third hole H3 may have a third area A3 in a plan view. The third hole H3 may have a third width W3 in a cross-sectional view.

In addition, the protecting layer LY2 includes a fourth hole H4 partially exposing the signal pad SP. The fourth hole H4 may have a fourth area A4 in a plan view. The fourth hole H4 may have a fourth width W4 in a cross-sectional view.

The organic layer 120 may provide a flat surface of the display substrate, and reduce a parasitic capacitance between the data line DL and the first pixel electrode PE1 or the second pixel electrode PE2.

The organic layer 120 includes a fifth hole H5 exposing the common line CL exposed by the first and second holes H1 and H2. The fifth hole H5 overlaps with the first and second holes H1 and H2. A lower edge of the organic layer 120 may be aligned with inner walls of the first and second holes H1 and H2, such that width of the fifth hole H5 at the lower edge of the organic layer 120 is considered the same as the first and second widths W1 and W2. The hole H5 may have a fifth area A5 greater than the first area A1 in a plan view. The hole H5 may have a fifth width W5 greater than the first width W1 in a cross-sectional view.

In addition, the organic layer 120 include a six hole H6 partially exposing the drain electrode DE exposed by the third hole H3 and the protecting layer LY2 adjacent to the third hole H3. The six hole H6 overlaps with the third hole H3. A lower edge of the organic layer 120 is spaced apart from the inner walls of the third hole H3, such that the width of the sixth hole H6 at the lower edge of the organic layer 120 may be larger than the third width W3 of the third hole H3. The sixth hole H6 may have a sixth area A6 larger than the third area A3 in a plan view. The sixth hole H6 may have a sixth width W6 larger than the third width W3 in a cross-sectional view.

In addition, the organic layer 120 includes a seventh hole H7 partially exposing the signal pad SP exposed by the fourth hole H4 and the protecting layer LY2 adjacent to the fourth hole H4. The seventh hole H7 overlaps with the fourth hole H4. A lower edge of the organic layer is spaced apart from the inner walls of the fourth hole H4, such that the width of the seventh hole H7 at the lower edge of the organic layer 120 may be larger than the fourth width W4 of the fourth hole H4. The seventh hole H7 may have a seventh area A7 larger than the fourth area A4 in a plan view. The seventh hole H7 may have a seventh width W7 larger than the fourth width W4 in a cross-sectional view.

The first, second and fifth holes H1, H2 and H5 form the first contact hole CTH1, the third and sixth holes H3 and H6 form the second contact hole CTH2, and the fourth and seventh holes H4 and H7 form the third contact hole CTH3.

The sixth and seventh holes H6 and H7 of the organic layer 120 partially exposes the protecting layer LY2 adjacent to the third and fourth holes H3 and H4, so that the second pixel electrode PE2 and the transparent electrode TE may be disposed along stepped profiles of the second and third contact holes CTH2 and CTH3, respectively. Thus, the second pixel electrode PE2 and the transparent electrode TE may be prevented from being disconnected.

The pixel insulating layer LY3 is disposed between the first pixel electrode PE1 and the second pixel electrode PE2. The pixel insulating layer LY3 insulates the first pixel electrode PE1 and the second pixel electrode PE2 from each other.

In the exemplary embodiment, longitudinal axes of the second pixel electrode PE2 and the slit SL are substantially parallel with the longitudinal axis of the data line DL. However, the second pixel electrode PE2 and the slit SL may not be parallel with the data line DL. That is, the second pixel electrode PE2 and/or the slit SL may be V-shaped in the plan view.

FIGS. 3A to 3F are cross-sectional views illustrating an exemplary embodiment of a method of manufacturing the display substrate of FIG. 1.

Figure 3A:
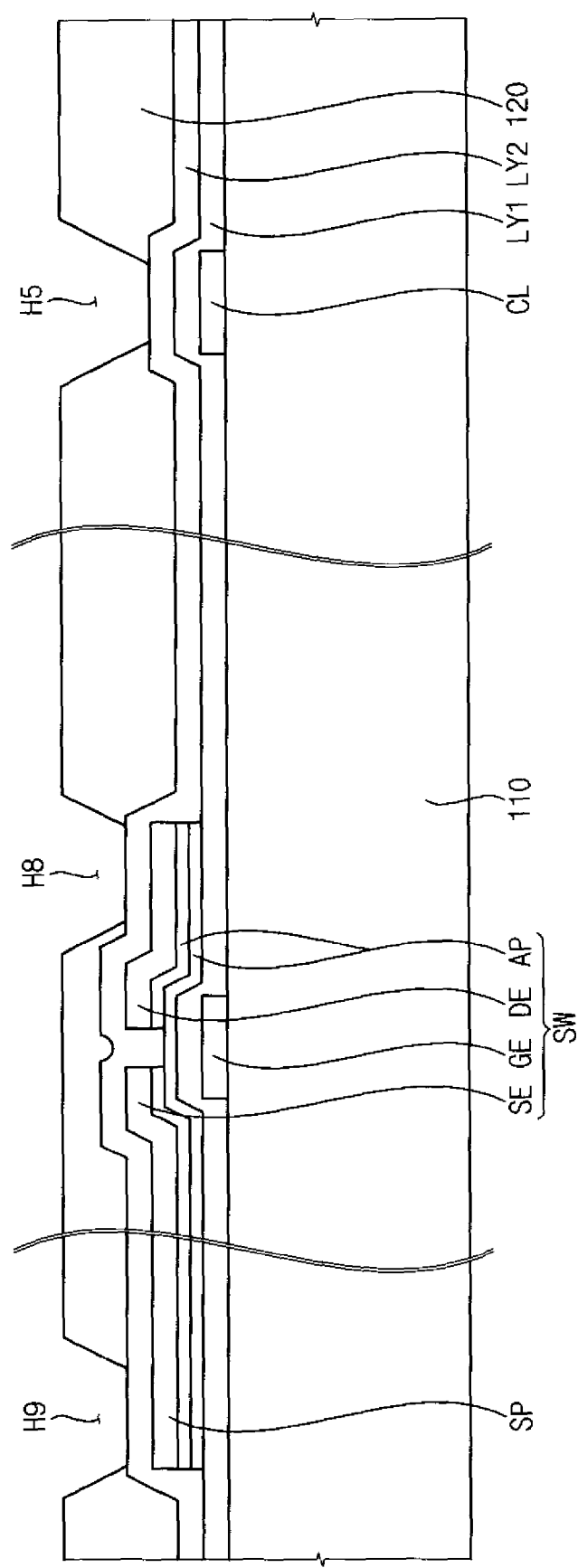
FIGS. 3A to 3F are cross-sectional views illustrating an exemplary embodiment of a method of manufacturing the display substrate of FIG. 1.

Referring to FIG. 3A, a gate pattern is formed on the base substrate 110. In one exemplary embodiment, for example, a gate metal layer is formed on the base substrate 110, the gate metal layer is patterned using a first mask, and then the gate line GL, the gate electrode GE extended from the gate line GL, and the common line CL substantially parallel to the gate line GL, are formed. As not shown, the storage line may be further formed on the base substrate 110.

Then, the gate insulating layer LY1, the active pattern AP and a data pattern are formed on the base substrate 110 including the gate pattern thereon. In one exemplary embodiment, for example, the gate insulating layer LY1, a semiconductor layer and a data metal layer are sequentially formed on the base substrate 110 including the gate pattern thereon. The semiconductor layer and the data metal layer are patterned using a second mask, and then the data line DL crossing the gate line GL, the active pattern AP overlapping with the gate electrode GE, the source electrode SE and the drain electrode DE, and the signal pad SP extended from the data line, are formed.

Then, the protecting layer LY2 and the organic layer 120 are sequentially formed on the base substrate 110 including the data pattern thereon. The organic layer 120 is patterned using a third mask, and then the fifth, eighth and ninth holes H5, H8 and H9 partially exposing the protecting layer LY2 respectively overlapping with the common line CL, the drain electrode DE and the signal pad SP, are formed.

Figure 3B:
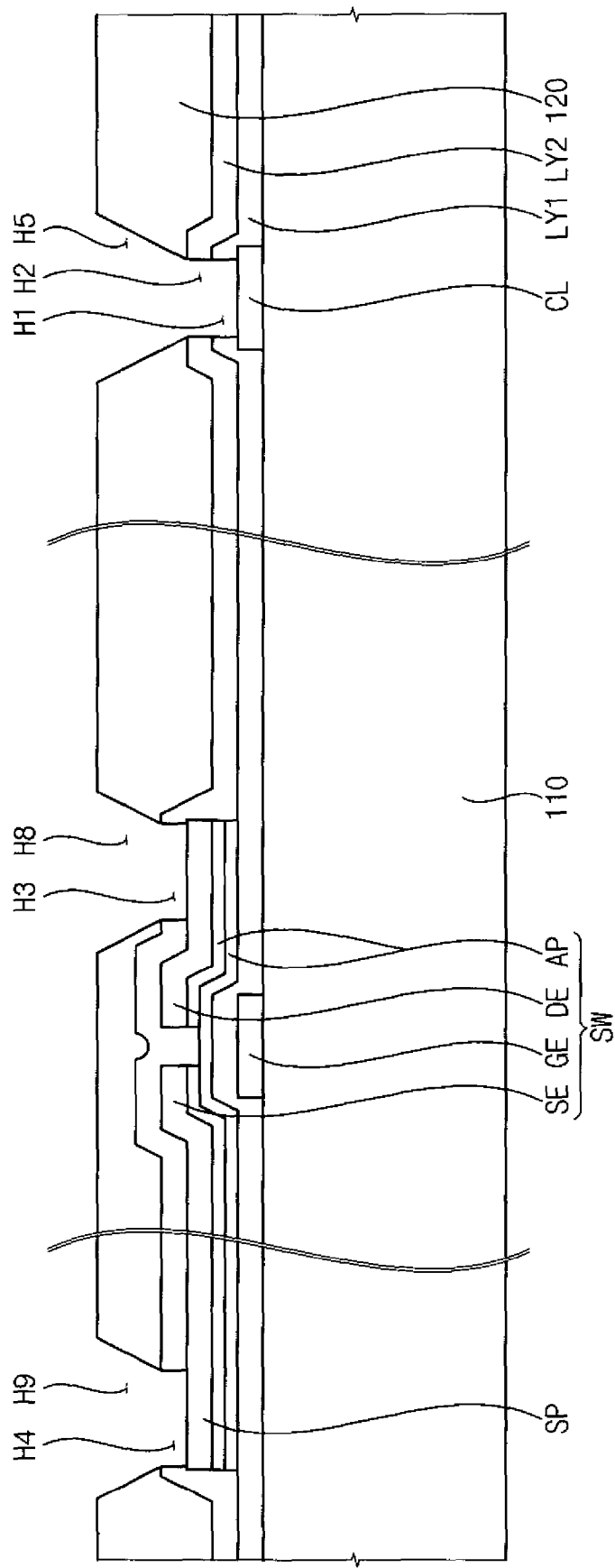

Referring to FIG. 3B, the protecting layer LY2 exposed by the fifth, eighth and ninth holes H5, H8 and H9 is patterned using the third mask, and then the second, third and fourth holes H2, H3 and H4 exposing the gate insulating layer LY1 overlapping with the common line CL, the drain electrode DE and the signal pad SP, are formed.

Since the second, third and fourth holes H2, H3 and H4 are more etched than the fifth, eighth and ninth holes H5, H8 and H9, under-cuts may be generated.

The gate insulating layer LY1 exposed by the second hole H2 is patterned, and then the first hole H1 exposing the common line CL is formed.

Figure 3C:
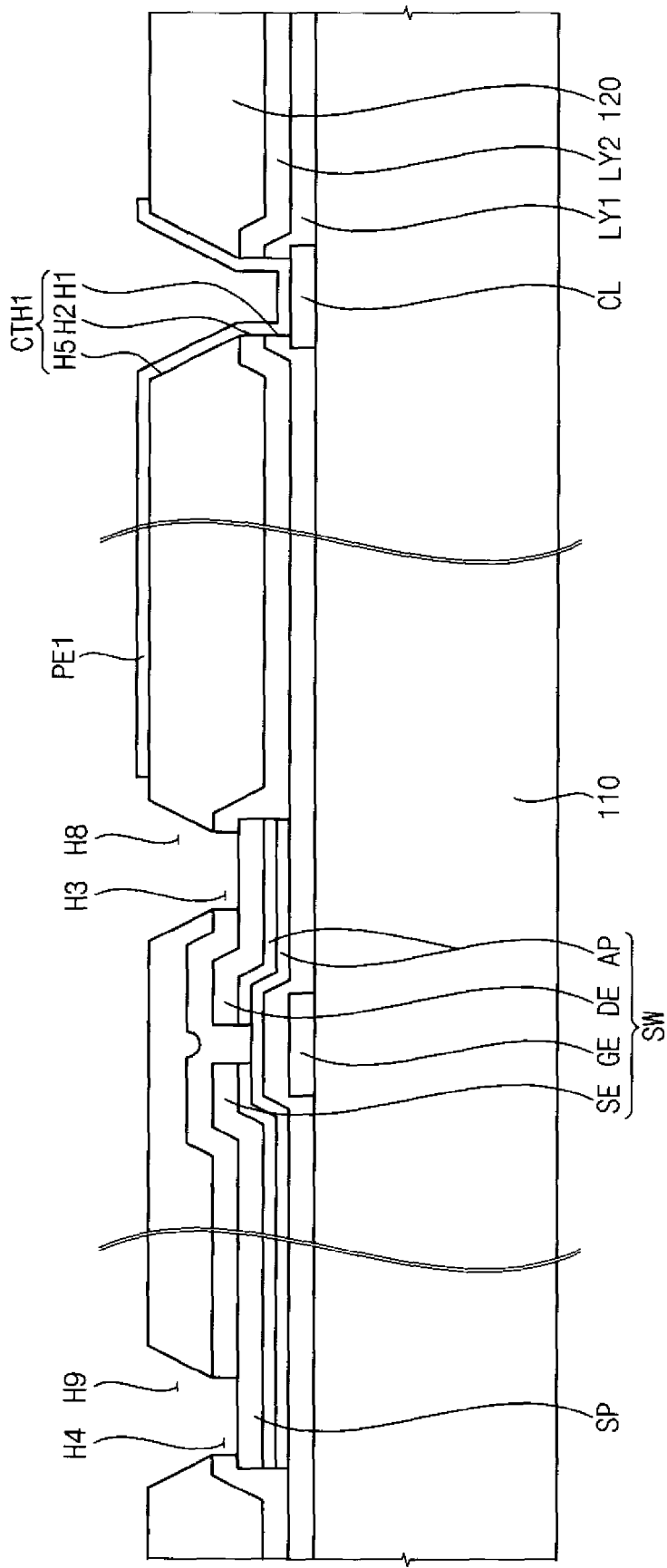

Referring to FIG. 3C, a first transparent electrode layer is formed on the organic layer 120 including the first, second, third, fourth, fifth, eighth and ninth holes H1, H2, H3, H4, H5, H8 and H9 therein. The first transparent electrode layer is patterned using a fourth mask, so that the first pixel electrode PE1 electrically connected to the common line CL via the first contact hole CTH1 including the first, second and fifth holes H1, H2 and H5, is formed.

Figure 3D:
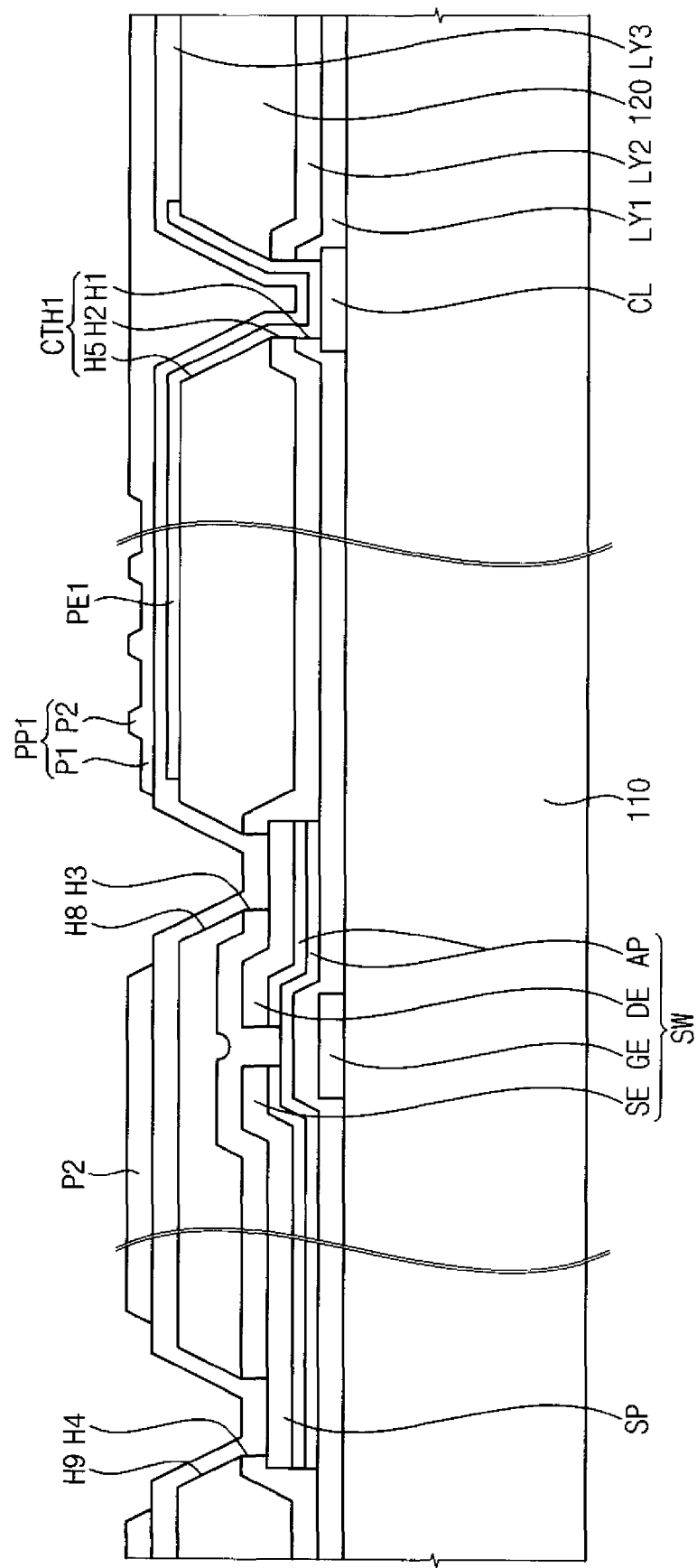

Referring to FIG. 3D, the pixel insulating layer LY3 and a first photoresist layer are sequentially formed on the base substrate 110 including the first pixel electrode PE1 thereon.

The first photoresist layer is patterned using a fifth mask, so that a first photo pattern PP1 is formed. In one exemplary embodiment, for example, the first photoresist layer overlapping with the drain electrode DE and the signal pad SP is totally removed, so that the pixel insulating layer LY3 is exposed. The first photoresist layer overlapping with the first pixel electrode PE1 is partially removed, so that the first photo pattern PP1 is formed, which includes a first pattern portion P1 having a first thickness, and a second pattern portion P2 having a second thickness larger than the first thickness. The fifth mask may be a half-tone mask or a slit mask.

Figure 3E:
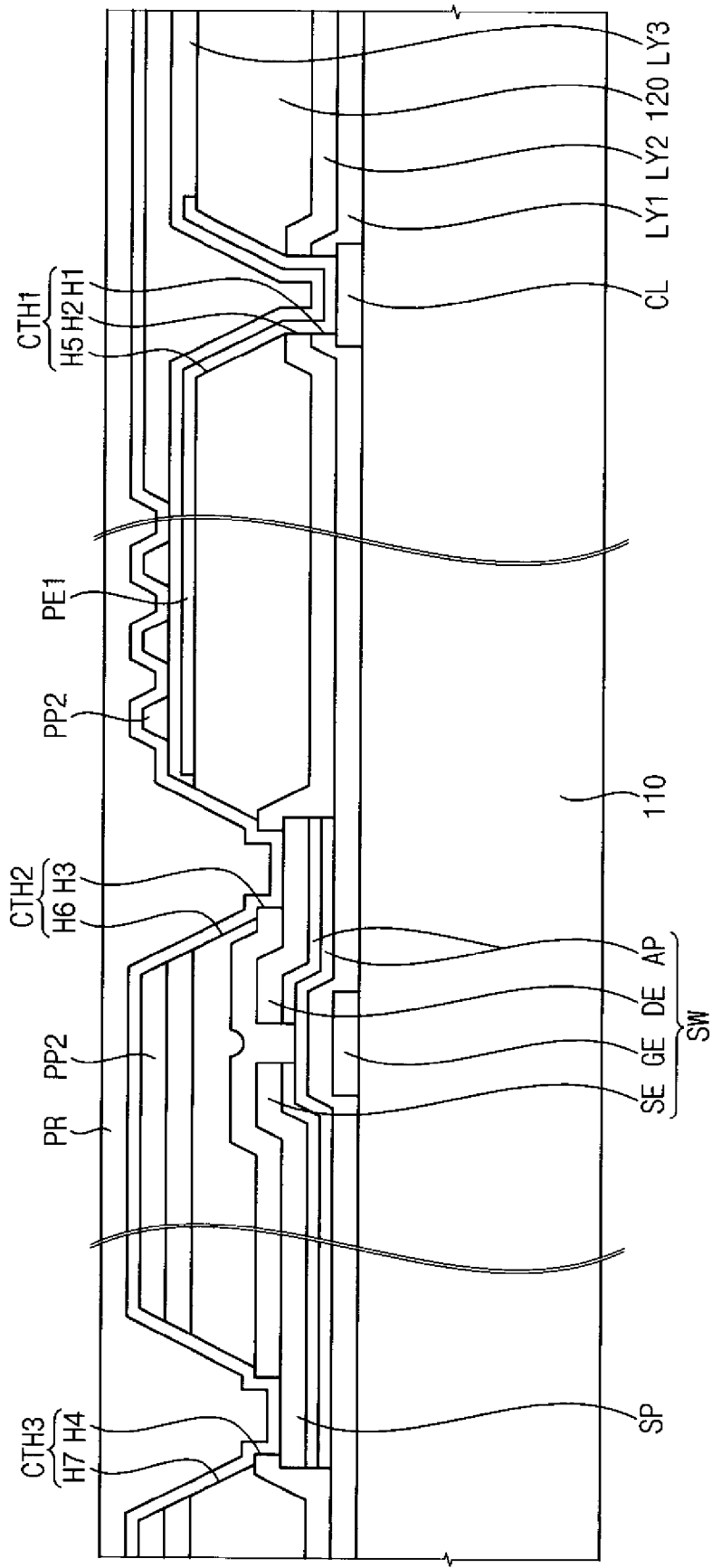

Referring to FIG. 3E, the first photo pattern PP1 is ashed so that a second photo pattern PP2 is formed.

In one exemplary embodiment, for example, the first photo pattern PP1 is ashed, so that the first pattern portion P1 and exposed pixel insulating layer LY3 are totally removed. The exposed pixel insulating layer LY3 is removed, and then exposed organic layer 120 is partially removed, so that the sixth and seventh holes H6 and H7 having widths larger than the eighth and ninth holes H8 and H9, are formed.

The exposed organic 120 is removed, and then the protecting layer LY2 adjacent to the third and fourth holes H3 and H4 is partially exposed. That is, the sixth and seventh areas A6 and A7 of the sixth and seventh holes H6 and H7 at the lower edge of the organic layer 120 may be larger than the third and fourth areas A3 and A4 of the third and fourth holes H3 and H4, respectively. Thus, the second pixel electrode PE2 to be formed hereinafter is formed along a stepped profile of the second contact hole CTH2 including the third and sixth holes H3 and H6, and the transparent electrode TE to be formed hereinafter is formed along a stepped profile of the third contact hole CTH3 including the fourth and seventh holes H4 and H7. Thus, disconnection of the second pixel electrode PE2 and the transparent electrode TE may be reduced or effectively prevented.

The second pattern portion P2 is partially ashed, so that the second photo pattern PP2 having a third thickness smaller than the second thickness.

The second transparent electrode layer and a second photoresist layer PR are sequentially formed on the base substrate 110 including the second photo pattern PP2 thereon.

Figure 3F:
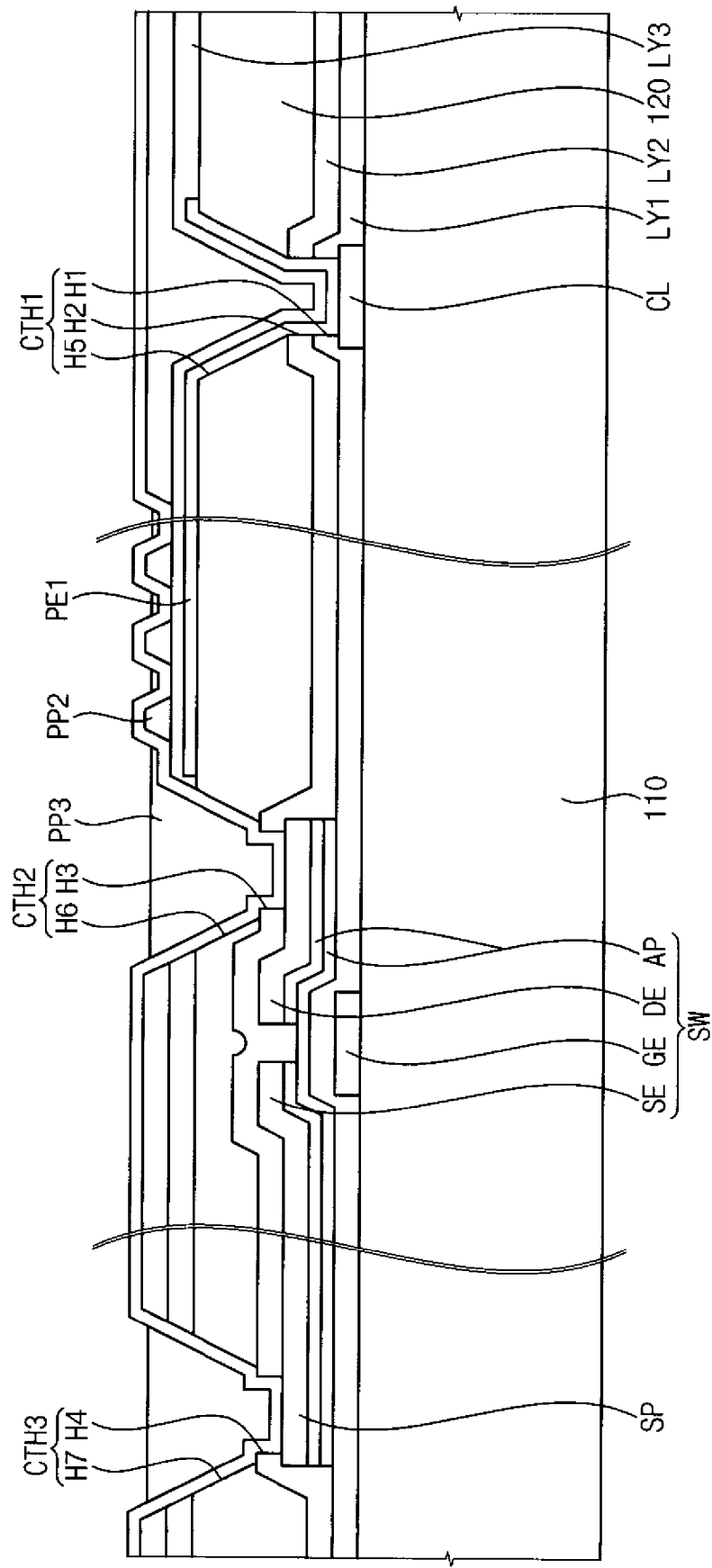

Referring to FIG. 3F, the second photoresist layer PR is ashed, so that the third photo pattern PP3 is formed, and the second transparent electrode layer is partially exposed.

Referring to FIG. 2 again, the exposed second transparent electrode layer is etched, so that the second pixel electrode PE2 electrically connected to the drain electrode DE and the transparent electrode TE electrically connected to the signal pad SP are formed. The exposed second transparent electrode layer is over etched, so that an upper surface of the second pixel electrode PE2 may be flattened.

Then, the second photo pattern PP2 and the third photo pattern PP3 are stripped, so that the display substrate illustrated in FIG. 2 is formed.

According to the exemplary embodiment, the second transparent electrode layer is patterned using the second and third photo patterns PP2 and PP3, so that a number of masks required when the display substrate is manufactured may be decreased.

In addition, the sixth and seventh holes H6 and H7 of the organic layer 120 exposing the drain electrode DE and the signal pad SP are formed when the first photo pattern PP1 is ashed. Since the sixth and seventh holes H6 and H7 are larger at a lower edge of the organic layer 120 than the third and fourth holes H3 and H4 of the protecting layer LY2 under the organic layer 120, generation of the under-cut may be reduced or effectively. Thus, disconnection of the second pixel electrode PE2 and the transparent electrode TE may be reduced or effectively prevented.

Figure 4:
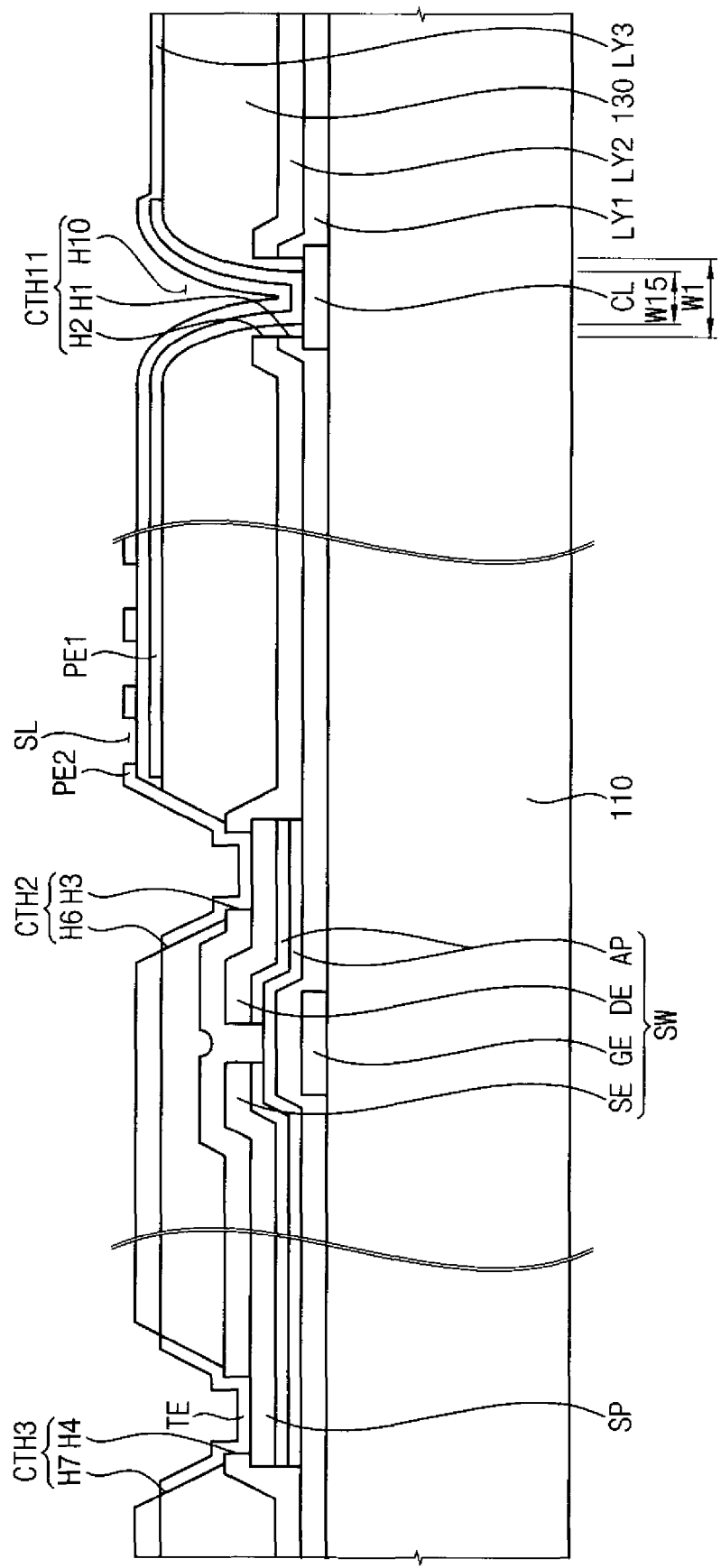
FIG. 4 is a cross-sectional view illustrating another exemplary embodiment of a display substrate according to the invention.

FIG. 4 is a cross-sectional view illustrating another exemplary embodiment of a display substrate according to the invention.

The exemplary embodiment of a display substrate is substantially the same as the previous exemplary embodiment of the display substrate of FIG. 1 except for a first contact hole, and thus the same reference numerals will be used to refer to the same or like parts as those described in the previous exemplary embodiment of FIG. 1, and any repetitive explanation concerning the above elements will be omitted.

Referring to FIG. 4, a common line CL is electrically connected to a first pixel electrode PE1 via a first contact hole CTH11, a drain electrode DE is electrically connected to a second pixel electrode PE2 via a second contact hole CTH2, and a signal pad SP is electrically connected to a transparent electrode TE via a third contact hole CTH3.

The organic layer 130 includes the first contact hole CTH11 exposing the common line CL exposed by the first hole H1 of a gate insulating layer LY1 and a second hole H2 of a protecting layer LY2.

The organic layer 130 covers a side surface of the gate insulating layer LY1 defining the first hole H1, a side surface of the protecting layer LY2 defining the second hole H2 and a top surface of the protecting layer LY2 adjacent to the side surface of the protecting layer LY2 defining the second hole H2.

In one exemplary embodiment, for example, the tenth contact hole H10 adjacent to the common line CL may have a fifth area at a lower edge of organic layer 130 smaller than a first area of the first hole H1 in a plan view. The tenth contact hole H10 may have a fifth width W15 at the lower edge of the organic layer 130 smaller than a first width W1 of the first hole H1 in a cross-sectional view.

FIGS. 5A to 5H are cross-sectional views illustrating an exemplary embodiment of a method of manufacturing the display substrate of FIG. 4.

Figure 5A:
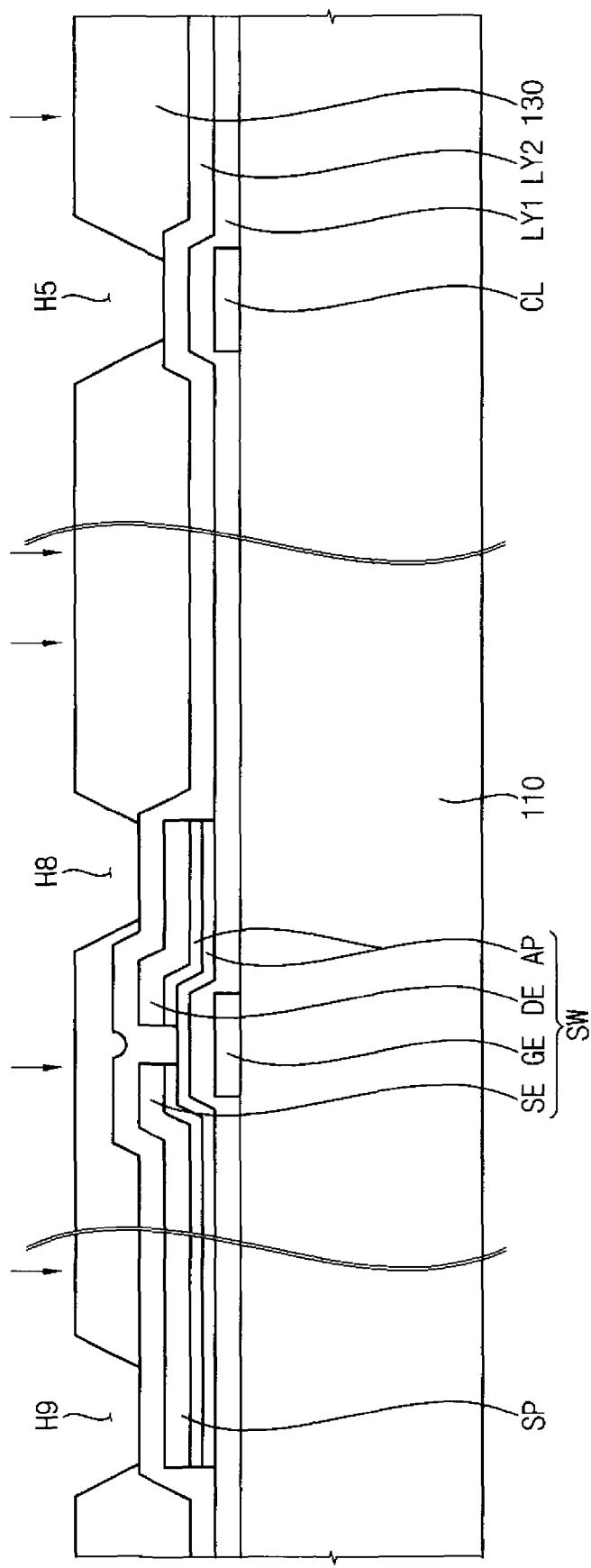

Referring to FIG. 5A, the organic layer 130 is formed on the base substrate 110 including a gate pattern including a gate line GL, a gate electrode GE and a common line CL, the gate insulating layer LY1, an active pattern AP, a data pattern including a data line DL, source and drain electrodes SE and DE and a signal pad SP, and the protecting layer LY2 thereon.

The organic layer 130 is patterned using a third mask, so that fifth, eighth and ninth holes H5, H8 and H9 partially exposing the protecting layer LY2 overlapping with the common line CL, the drain electrode DE and the signal pad SP, are formed.

Then, the organic layer 130 in which the fifth, eighth and ninth holes H5, H8 and H9 are formed is first baked (indicated by the downward arrows) at a first temperature during a first time. In one exemplary embodiment, for example, a range of the first temperature may be about 100 degrees Celsius (° C.) to about 200° C., and a range of the first time may be about 30 minutes to about 2 hours.

Referring to FIG. 5B, the protecting layer LY2 exposed by the fifth, eighth and ninth holes H5, H8 and H9 is patterned using the third mask, so that second, third and fourth holes H2, H3 and H4 partially exposing the gate insulating layer LY1 overlapping with the common line CL, the drain electrode DE and the signal pad SP, are formed.

Since the second, third and fourth holes H2, H3 and H4 is more etched than the fifth, eighth and ninth holes H5, H8 and H9, under-cuts may be generated.

The gate insulating layer LY1 exposed by the second hole H2 is patterned, so that the first hole H1 exposing the common line CL is formed.

Then, the organic layer 130 is second baked (indicated by the downward arrows) at a second temperature different from the first temperature during a second time. In one exemplary embodiment, for example, a range of the second temperature may be about 200° C. to about 500° C., and a range of the second time may be about 30 minutes to about 5 hours.

Figure 5C:
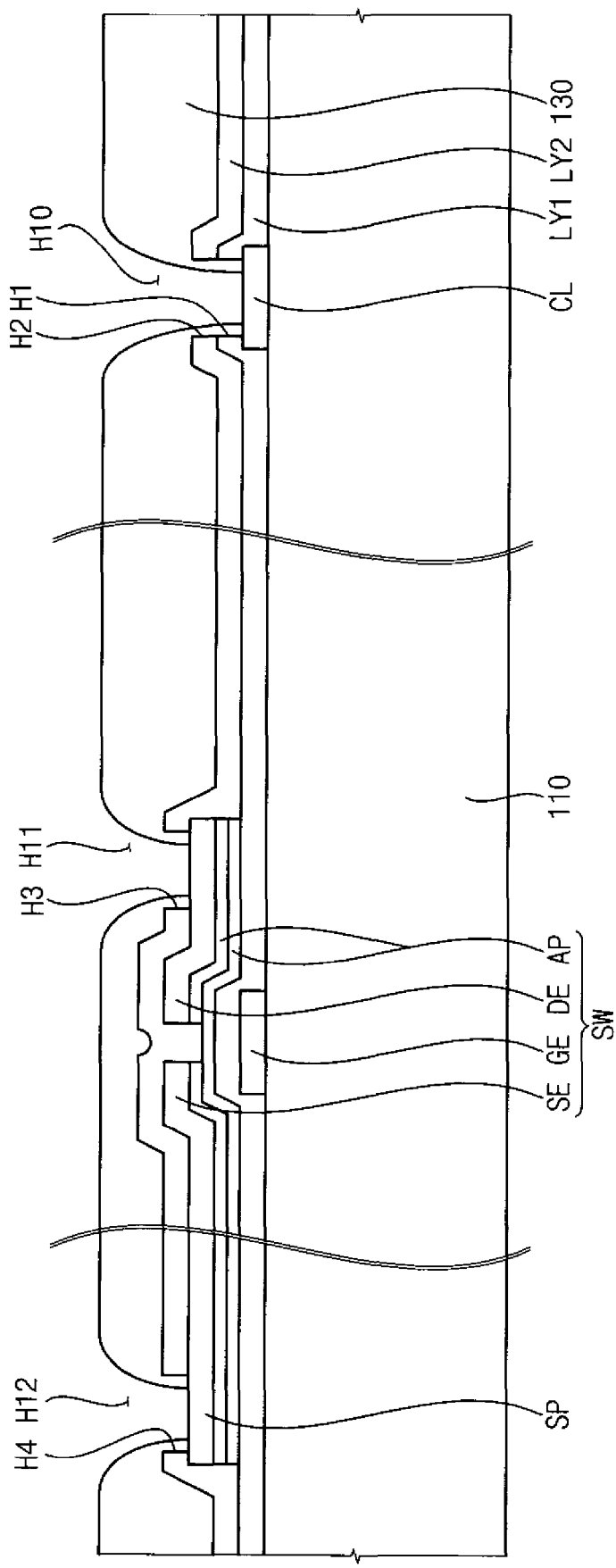

Referring to FIG. 5C, the organic layer 130 is baked twice, so that the organic layer 130 becomes flowable. Thus, a portion of the organic layer 130 moves from its original position and covers the side surface of the gate insulating layer LY1 defining the first hole H1, the second side surface of the protecting layer LY2 defining the second hole H2 exposing the common line CL, and the top surface of the protecting layer LY2 adjacent to the side surface of the protecting layer LY2. Therefore, the tenth contact hole H10 having a fifth area at a lower edge of the organic layer 130 smaller than each of the first and second areas of the first and second holes H1 and H2, is formed in the organic layer 130.

In addition, when the organic layer 130 flows, the organic layer 130 covers a side surface of the protecting layer LY2 defining the third hole H3 and a top surface of the protecting layer LY2 adjacent to the side surface of the protecting layer LY2. Thus, an eleventh hole H11 having an eleventh area at a lower edge of the organic layer 130 smaller than the third area of the third hole H3, is formed in the organic layer 130.

In addition, when the organic layer 130 flows, the organic layer 130 covers a side surface of the protecting layer LY2 defining the fourth hole H4 and a top surface of the protecting layer LY2 adjacent to the side surface of the protecting layer LY2. Thus, a twelfth hole H12 having a twelfth area at the lower edge of the organic layer 130 smaller than the fourth area of the fourth hole H4, is formed in the organic layer 130.

Figure 5D:
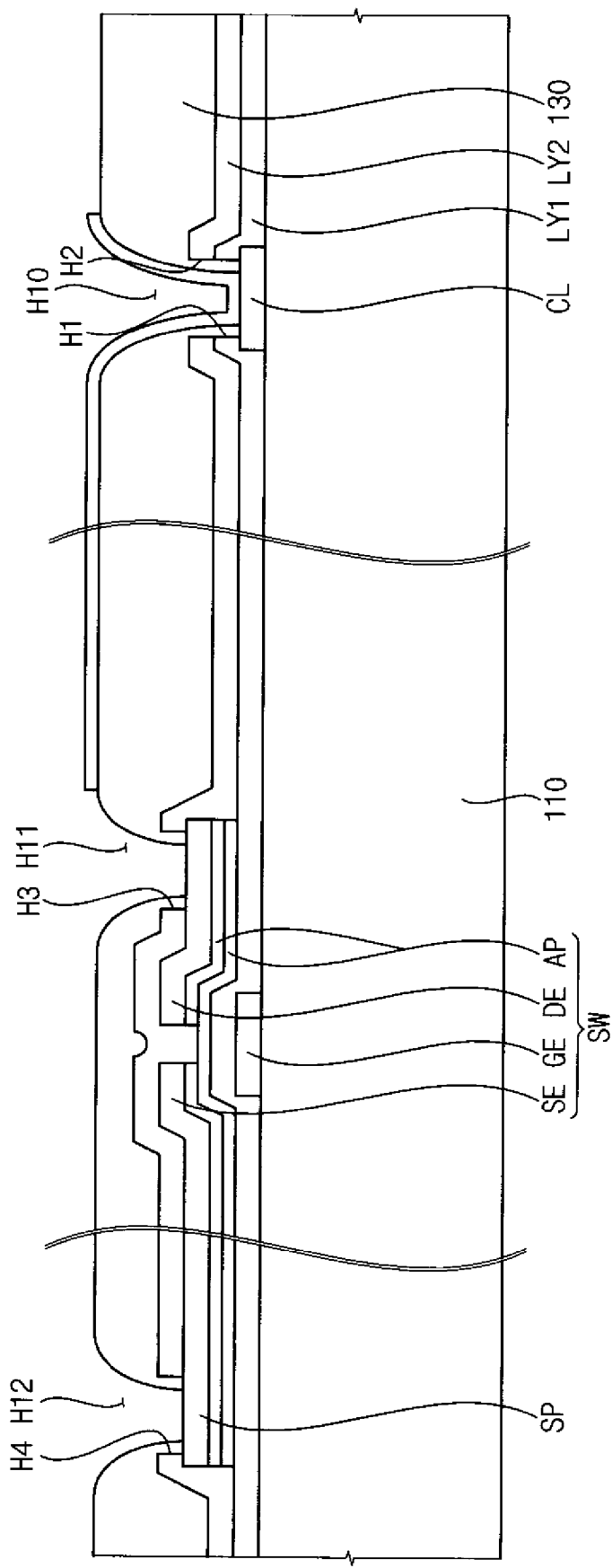

Referring to FIG. 5D, a first transparent electrode layer is formed on the organic layer 130 including the first, second, third, fourth, tenth, eleventh and twelfth holes H1, H2, H3, H4, H10, H11 and H12 therein. The first transparent electrode layer is patterned using a fourth mask, so that the first pixel electrode PE1 electrically connected to the common line CL via the first contact hole CTH11 including the first, second and tenth holes H1, H2 and H10, is formed.

Figure 5E:
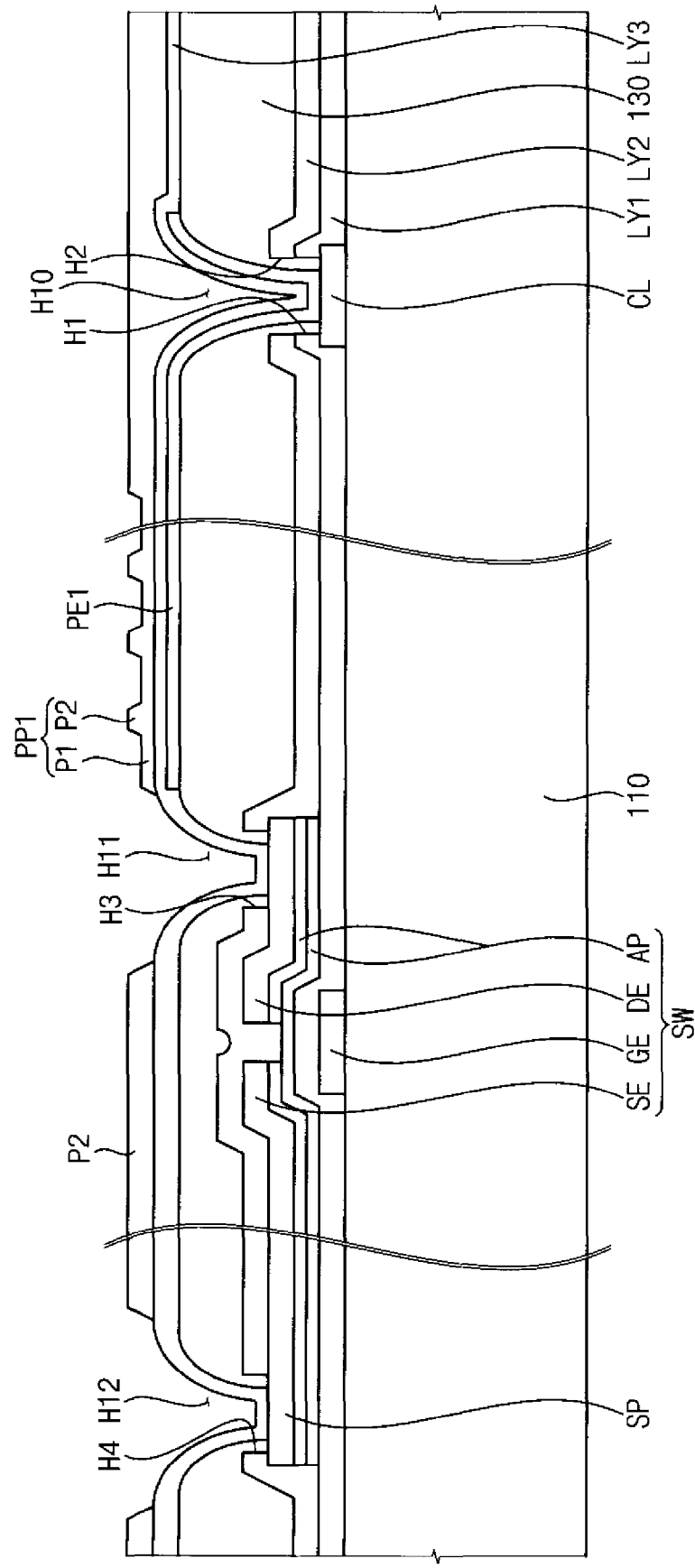

Referring to FIG. 5E, the pixel insulating layer LY3 and a first photoresist layer are sequentially formed on the base substrate 110 including the first pixel electrode PE1 thereon.

The first photoresist layer is patterned using a fifth mask, so that a first photo pattern PP1 is formed. In one exemplary embodiment, for example, the first photoresist layer overlapping with the drain electrode DE and the signal pad SP is totally removed, so that the pixel insulating layer LY3 is exposed. The first photoresist layer overlapping with the first pixel electrode PE1 is partially removed, so that the first pattern PP1 is formed, which includes first pattern portion P1 having a first thickness and a second pattern portion P2 having a second thickness larger than the first thickness. The fifth mask may be a half-tone mask or a slit mask.

Figure 5F:
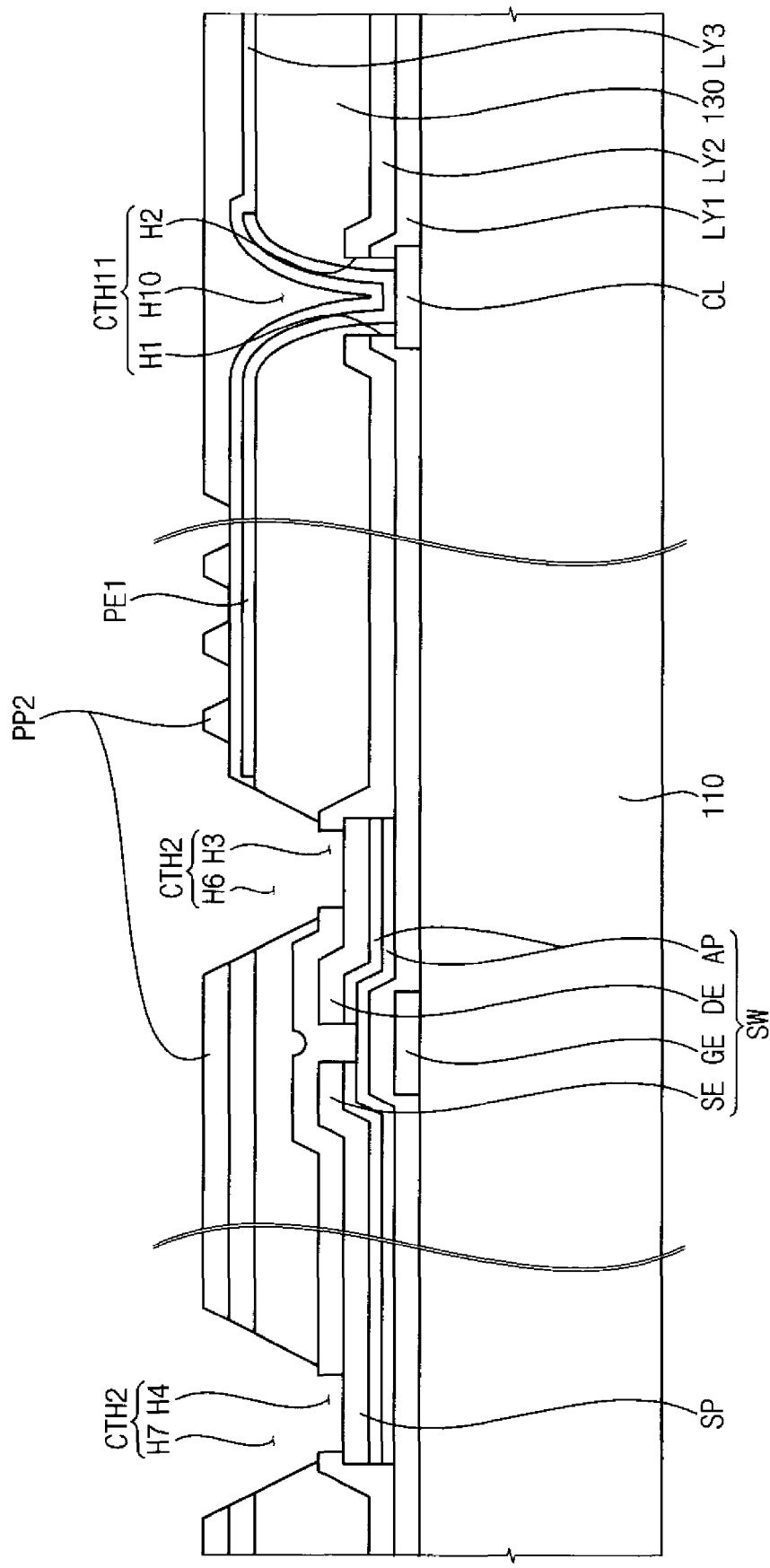

Referring to FIG. 5F, the first photo pattern PP1 is ashed, so that the second photo pattern PP2 is formed.

In one exemplary embodiment, for example, the first photo pattern PP1 is ashed, so that the first pattern portion P1 and exposed pixel insulating layer LY3 are totally removed. The exposed pixel insulating layer LY3 is removed, and then exposed organic layer 130 is partially removed, so that the sixth and seventh holes H6 and H7 having widths larger at the lower edge of the organic layer 130 than the eleventh and twelfth holes H11 and H12, are formed.

Figure 5G:
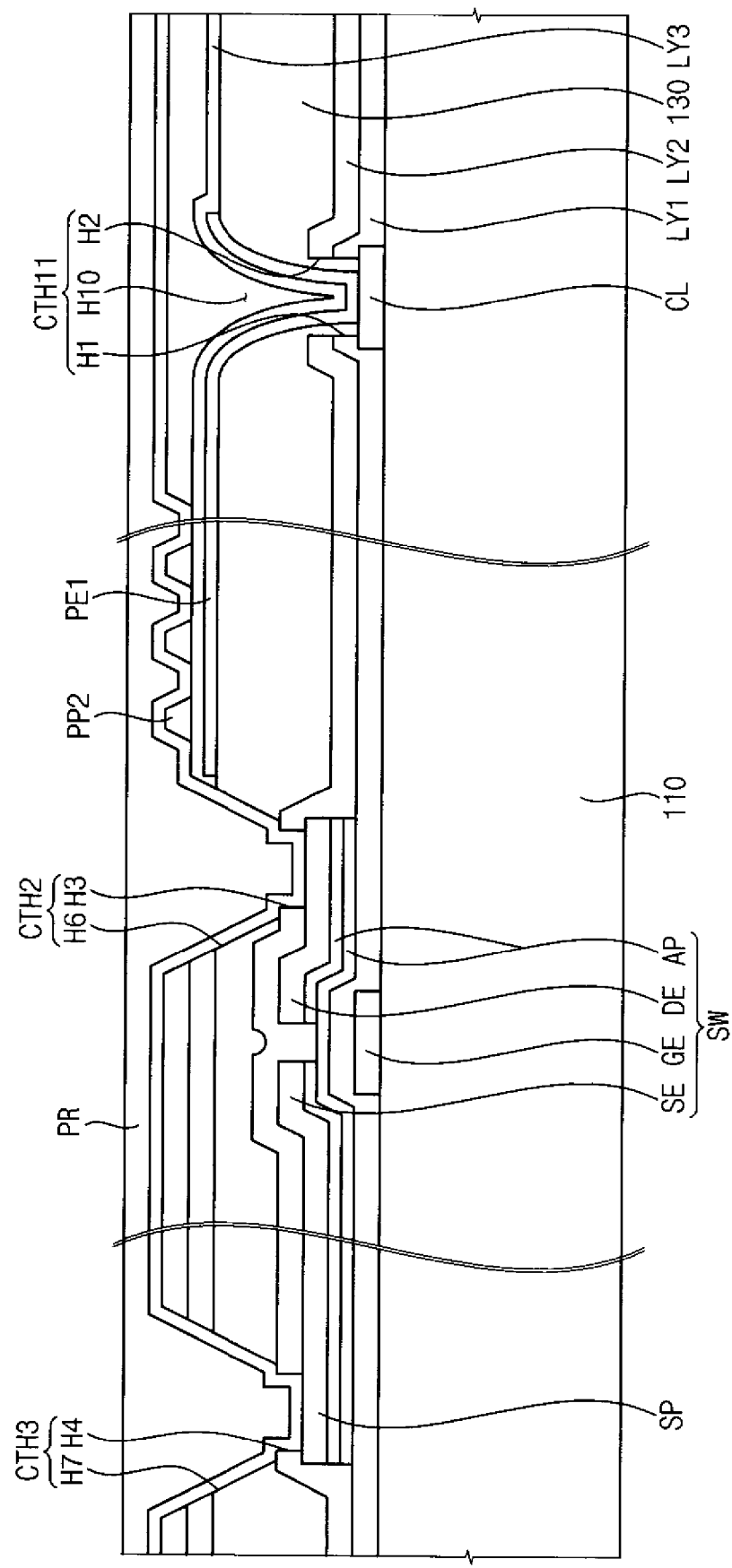

Referring to FIG. 5G, a second transparent electrode layer and a second photoresist layer PR are sequentially formed on the base substrate 110 including the second photo pattern PP2 thereon.

Figure 5H:
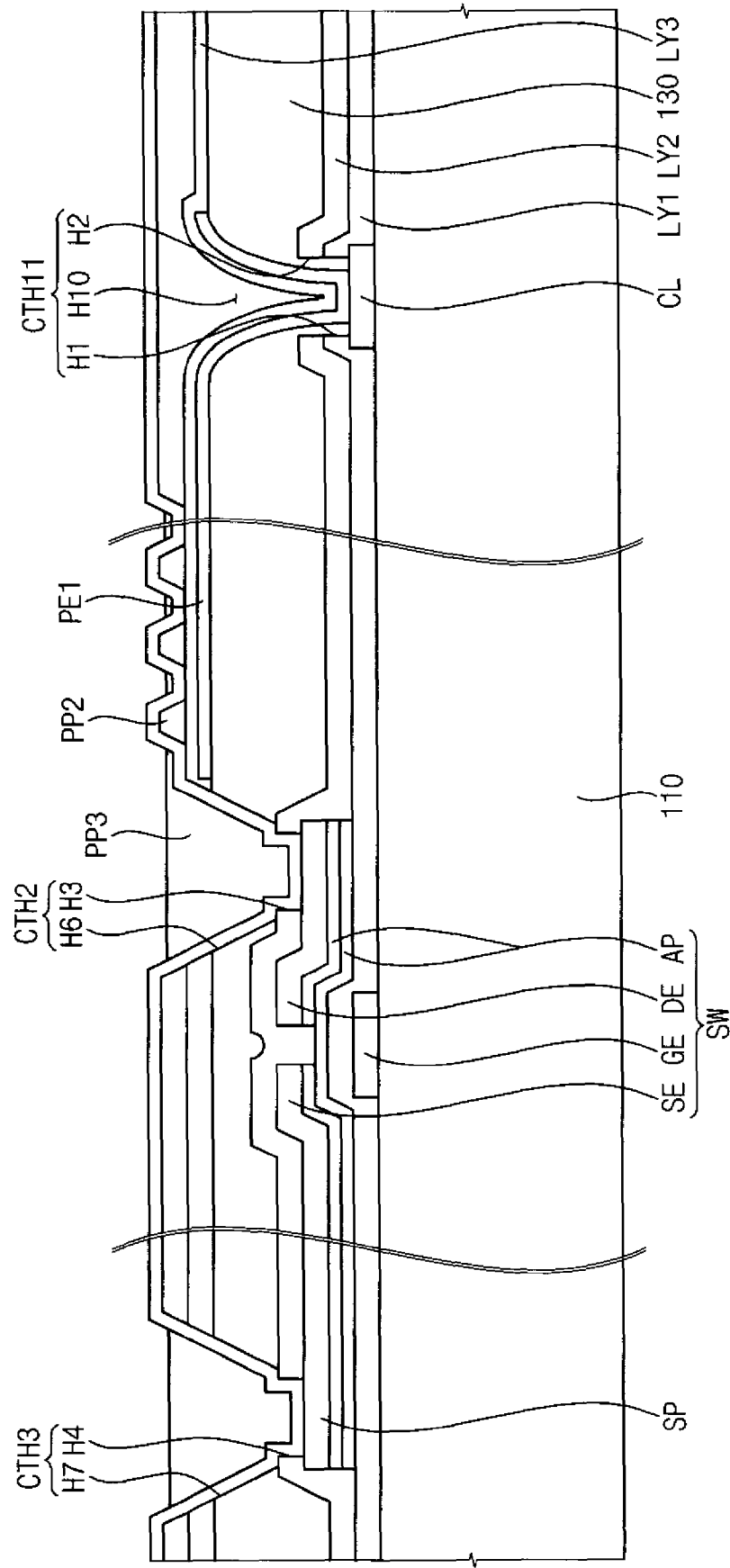

Referring to FIG. 5H, the second photoresist layer PR is ashed, so that a third photo pattern PP3 is formed and the second transparent electrode layer is partially exposed.

Referring to FIG. 4 again, exposed second transparent electrode layer is etched, so that the second pixel electrode PE2 electrically connected to the drain electrode DE and the transparent electrode TE electrically connected to the signal pad SP are formed. The exposed second transparent electrode layer is over etched, so that an upper surface of the second pixel electrode PE2 may be flattened.

Then, the second photo pattern PP2 and the third photo pattern PP3 are stripped, so that the display substrate illustrated in FIG. 4 is formed.

According to the exemplary embodiment, the organic layer 130 is firstly baked at the first temperature during the first time, the protecting layer LY2 and the gate insulating layer LY1 are etched, and then the organic layer 130 is secondly baked at the second temperature higher than the first temperature during the second time, so that the first contact hole CTH11 may have a profile without the under-cut. Thus, although the first pixel electrode PE1 is formed along the first contact hole CTH11, disconnection of the first pixel electrode PE1 may be reduced or effectively prevented.

Figure 6:
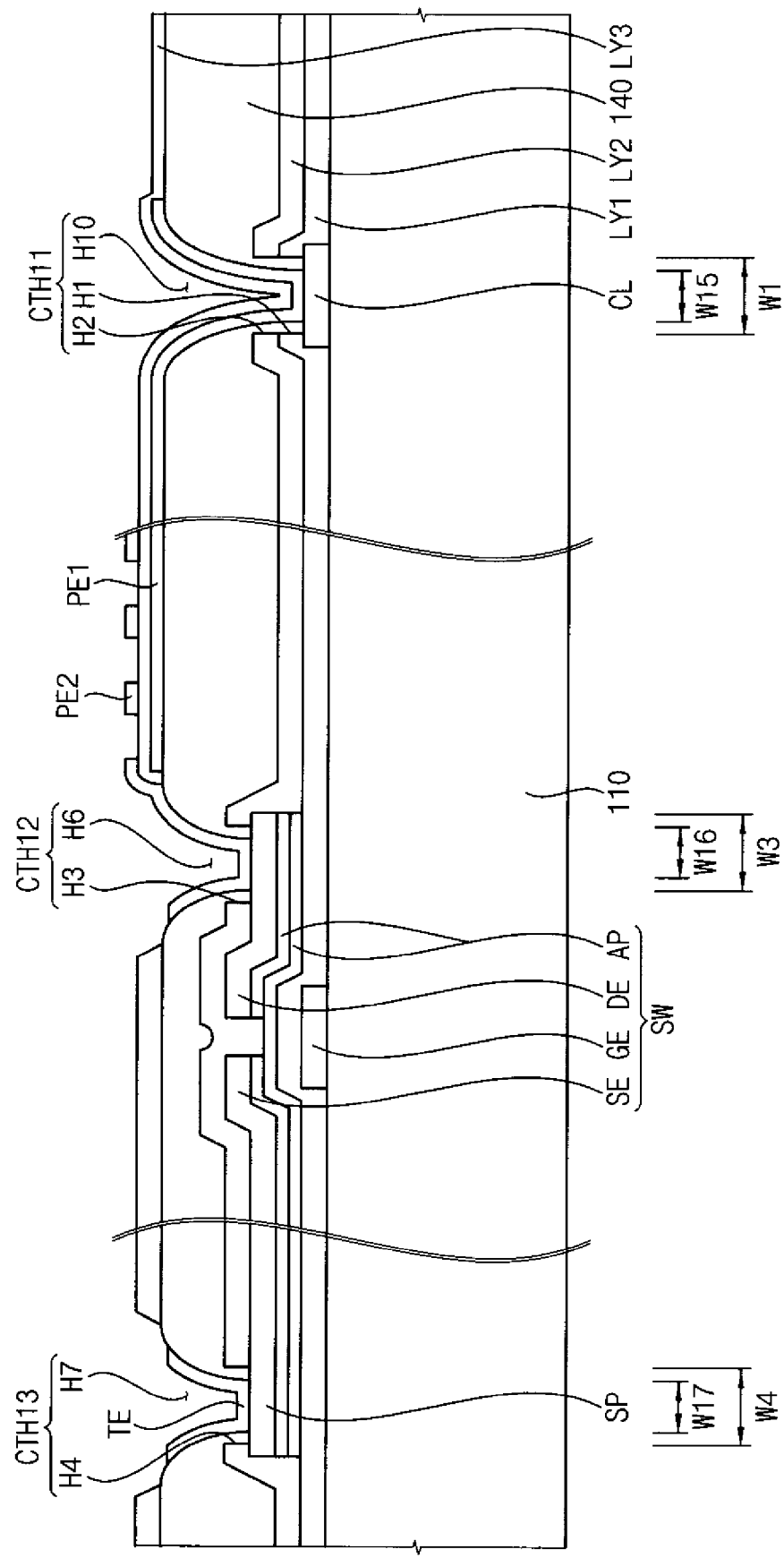
FIG. 6 is a cross-sectional view illustrating still another exemplary embodiment of a display substrate according to the invention.

FIG. 6 is a cross-sectional view illustrating still another exemplary embodiment of a display substrate according to still the invention.

The exemplary embodiment of a display substrate is substantially the same as the previous exemplary embodiment of the display substrate of FIG. 1 except for first, second and third contact holes, and thus the same reference numerals will be used to refer to the same or like parts as those described in the previous exemplary embodiment of FIG. 1 and any repetitive explanation concerning the above elements will be omitted.

Referring to FIG. 6, a common line CL is electrically connected to a first pixel electrode PE1 via a first contact hole CTH11, a drain electrode DE is electrically connected to a second pixel electrode PE2 via a second contact hole CTH12, and a signal pad SP is electrically connected to a transparent electrode TE via a third contact hole CTH13.

A organic layer 140 includes the tenth contact hole H10 exposing the common line CL exposed by a first hole H1 of a gate insulating layer LY1 and a second hole H2 of a protecting layer LY2.

The organic layer 140 covers a side surface of the gate insulating layer LY1 defining the first hole H1, a side surface of the protecting layer LY2 defining the second hole H2 exposing the common line CL and a top surface of the protecting layer LY2 adjacent to the side surface of the protecting layer LY2.

In one exemplary embodiment, for example, the tenth contact hole H10 adjacent to the common line CL may have a fifth area at a lower edge of the organic layer 140 smaller than a first area of the first hole H1 in a plan view. The tenth contact hole H10 may have a fifth width W15 at the lower edge of the organic layer 140 smaller than a first width W1 of the first hole H1 in a cross-sectional view.

In addition, the organic layer 140 includes a sixth contact hole H6 exposing the drain electrode DE exposed by a third hole H3 of the protecting layer LY2.

The organic layer 140 covers a side surface of the protecting layer LY2 defining the third hole H3 and a top surface of the protecting layer LY2 adjacent to the side surface of the protecting layer LY2.

In one exemplary embodiment, for example, the sixth contact hole H6 adjacent to the drain electrode DE may have a sixth area at a lower edge of the organic layer 140 smaller than a third area of the third hole H3 in a plan view. The sixth contact hole H6 may have a sixth width W16 at the lower edge of the organic layer 140 smaller than a third width W3 of the third hole H3 in a cross-sectional view.

In addition, the organic layer 140 includes a seventh contact hole H7 exposing the signal pad SP exposed by a fourth hole H4 of the protecting layer LY2.

The organic layer 140 covers a side surface of the protecting layer LY2 defining the fourth hole H4 exposing the signal pad SP and a top surface of the protecting layer LY2 adjacent to the side surface of the protecting layer LY2.

In one exemplary embodiment, for example, the seventh contact hole H7 adjacent to the signal pad SP may have a seventh area at a lower edge of the organic layer 140 smaller than a fourth area A4 of the fourth hole H4 in a plan view. The seventh contact hole H7 may have a seventh width W17 at the lower edge of the organic layer 140 smaller than a fourth width W4 of the fourth hole H4 in a cross-sectional view.

Figure 7A:
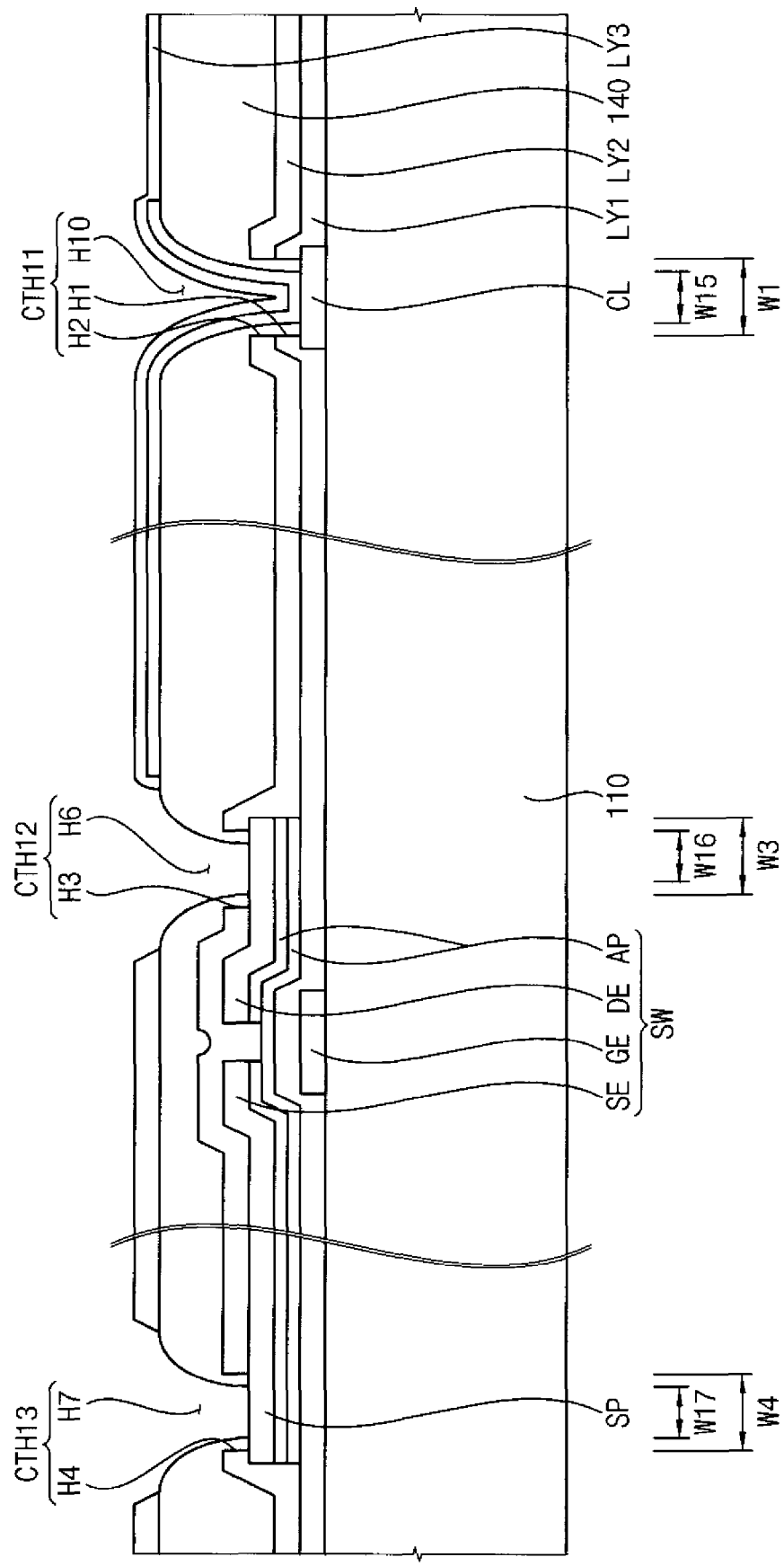
FIGS. 7A to 7B are cross-sectional views illustrating an exemplary embodiment of a method of manufacturing the display substrate of FIG. 6.
Figure 7B:
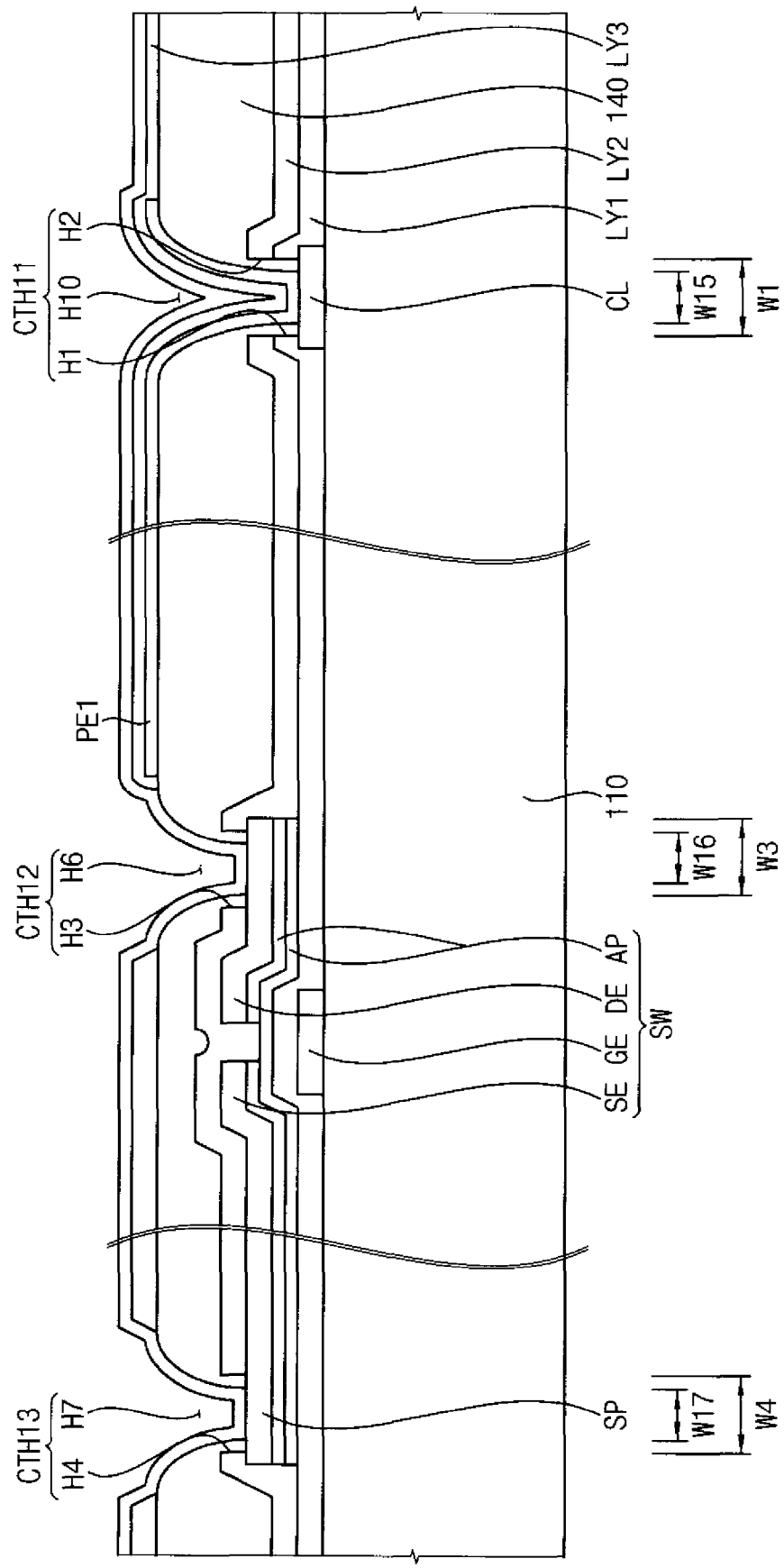

FIGS. 7A to 7B are cross-sectional views illustrating an exemplary embodiment of a method of manufacturing the display substrate of FIG. 6.

Referring to FIG. 7A, the organic layer 140 is formed on a base substrate 110 including a gate pattern including a gate line GL, a gate electrode GE and a common line CL, a gate insulating layer LY1, an active pattern AP, a data pattern including a data line DL, source and drain electrodes SE and DE and a signal pad SP and a protecting layer LY2 thereon. Then the organic layer 140 is patterned using a third mask, so that fifth, eighth and ninth holes H5, H8 and H9 are formed.

The organic layer 140 in which the fifth, eighth and ninth holes H5, H8 and H9 are formed is firstly baked at a first temperature during a first time, the protecting layer LY2 and the gate insulating layer LY1 are etched, and then the organic layer 130 is secondly baked at a second temperature different from the first temperature during a second time.

Since the organic layer 140 is baked twice, the organic layer 140 becomes flowable. Thus, a portion of the organic layer 140 covers the side surface of the gate insulating layer LY1 defining the first hole H1, a side surface of the protecting layer LY2 defining the second hole H2 exposing the common line CL, and a top surface of the protecting layer LY2 adjacent to the side surface of the protecting layer LY2. Therefore, the tenth contact hole H10 is formed in the organic layer 140, which has a fifth area at a lower edge of the organic layer 140 smaller than each of the first and second areas and of the first and second holes H1 and H2.

In addition, when the organic layer 140 flows, the organic layer 140 covers a side surface of the protecting layer LY2 defining the third hole H3 and a top surface of the protecting layer LY2 adjacent to the side surface of the protecting layer LY2. Thus, the eleventh contact hole H11 is formed in the organic layer 140, which has the eleventh area at the lower edge of the organic layer 140 smaller than the third area of the third hole H3.

In addition, when the organic layer 140 flows, the organic layer 140 covers a side surface of the protecting layer LY2 defining the fourth hole H4 and a top surface of the protecting layer LY2 adjacent to the side surface of the protecting layer LY2. Thus, the twelfth contact hole H12 is formed in the organic layer 140, which has the twelfth area at the lower edge of the organic layer 140 smaller than the fourth area of the fourth hole H4.

A first transparent electrode layer is formed on the organic layer 140 including the first, second third, fourth, tenth, eleventh and twelfth holes H1, H2, H3, H4, H10, H11 and H12 therein. The first transparent electrode layer is patterned using a fourth mask, so that a first pixel electrode PE1 electrically connected to the common line CL via the first contact hole CTH11 including the first, second and tenth holes H1, H2 and H10.

Then, the pixel insulating layer LY3 is formed on the base substrate 110 including the first pixel electrode PE1 thereon. The pixel insulating layer LY3 is patterned using a fifth mask, so that the drain electrode DE and the signal pad SP are exposed through the eleventh and twelfth holes H11 and H12.

Referring to FIG. 7B, a second transparent electrode layer is formed on the base substrate 110 including the pixel insulating layer LY3.

Referring to FIG. 6 again, the second transparent electrode layer is patterned using a sixth mask, so that the second pixel electrode PE2 electrically connected to the drain electrode DE via the second contact hole CTH12 including the third and sixth holes H3 and H6, and the transparent electrode TE electrically connected to the signal pad SP via the third contact hole CTH13 including the fourth and seventh holes H4 and H7, are formed. Thus, a display substrate illustrated in FIG. 6 is formed.

According to the exemplary embodiment, the organic layer 140 is firstly baked at the first temperature during the first time, the protecting layer LY2 is etched, and then the organic layer 140 is secondly baked at the second temperature higher than the first temperature during the second time, so that the second and third contact holes CTH12 and CTH13 may have profiles without the under-cut, respectively. Thus, although the second pixel electrode PE2 and the transparent electrode TE are formed along the second and third contact holes CTH12 and CTH13, disconnection of the second pixel electrode PE2 and the transparent electrode TE may be reduced or effectively prevented.

In addition, the first contact hole CTH11 may have a profile without the under-cut. Thus, although the first pixel electrode PE1 is formed along the first contact hole CTH11, disconnection of the first pixel electrode PE1 may be reduced or effectively prevented.

According to one or more exemplary embodiments of the invention, a second pixel electrode formed over the first pixel electrode is patterned using a pixel insulating layer which itself is patterned using a mask and a photo pattern on the pixel protecting layer, so that a number of masks required in manufacturing process of a display substrate may be reduced.

In addition, a side surface of an organic layer forming a contact hole is removed when the photo pattern is ashed, so that under-cut of the contact hole may be removed. Thus, disconnection of the second pixel electrode may be reduced or effectively prevented.

In addition, the organic layer is baked after the organic layer and a protecting layer or a gate insulating layer under the organic layer are patterned, so that the under-cut of the contact hole may be removed. Thus, disconnection of the second pixel electrode may be reduced or effectively prevented.

Therefore, the reliability of a display substrate may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
a base substrate;
a switching element on the base substrate and including a gate electrode, a source electrode and a drain electrode;
a protecting layer on the switching element, in which is defined a first hole which exposes the drain electrode;
an organic layer on the protecting layer, in which is defined a second hole which exposes a side surface of the protecting layer which defines the first hole, and exposes a top surface of the protecting layer which is adjacent to the side surface of the protecting layer which defines the first hole;
a second pixel electrode which is electrically connected to the drain electrode via the first and second holes; and
a first pixel electrode between the organic layer and second pixel electrode which is electrically connected to the drain electrode via the first and second holes, the first pixel electrode overlapped by the second pixel electrode,
wherein the entire top surface of the protecting layer exposed by the second hole of the organic layer makes contact with the second pixel electrode.

2. The display substrate of claim 1, further comprising:
a data line which extends from the source electrode; and
a signal pad which extends from the data line,
wherein
the protecting layer overlaps the signal pad, and a third hole which exposes the signal pad is further defined in the protecting layer which overlaps the signal pad, and
a fourth hole is further defined in the organic layer, exposes a side surface of the protecting layer which defines the third hole and exposes a top surface of the protecting layer which is adjacent to the side surface of the protecting layer which defines the third hole.

3. The display substrate of claim 1, further comprising:
a common voltage line including a substantially same material as the gate electrode, through which a common voltage is transmitted; and
an insulating layer on the common voltage line, between the substrate and the protecting layer, in which is defined a fifth hole which exposes the common voltage line,
wherein
the protecting layer is on the insulating layer, and a sixth hole which overlaps the fifth hole is further defined in the protecting layer, and
the organic layer overlaps a side surface of the insulating layer which defines the fifth hole and a side surface of the protecting layer which defines the sixth hole, and a seventh hole which exposes the common voltage line is further defined in the organic layer.

4. The display substrate of claim 1, further comprising:
a common voltage line including a substantially same material as the gate electrode, through which a common voltage is transmitted; and
an insulating layer on the common voltage line, between the substrate and the protecting layer, in which is defined a fifth hole which exposes the common voltage line,
wherein
the protecting layer is on the insulating layer, and a sixth hole which overlaps the fifth hole is further defined in the protecting layer, and
a seventh hole which exposes a side surface of the protecting layer which defines the sixth hole is further defined in the organic layer.

5. The display substrate of claim 1, wherein a width of the second hole is larger than a width of the first hole.

6. A display substrate comprising:
a base substrate;
a switching element on the base substrate and including a gate electrode, a source electrode and a drain electrode;
a protecting layer on the switching element, in which is defined a first hole which exposes the drain electrode;
an organic layer on the protecting layer overlapping a side surface of the protecting layer which defines the first hole, in which is defined a second hole which exposes the drain electrode;
a second pixel electrode which is electrically connected to the drain electrode at the first and second holes; and
a first pixel electrode between the organic layer and second pixel electrode which is electrically connected to the drain electrode via the first and second holes, the first pixel electrode overlapped by the second pixel electrode,
wherein the entire side surface of the protecting layer overlapped by the organic layer makes contact with the organic layer.

7. The display substrate of claim 6, further comprising:
a data line which extends from the source electrode; and
a signal pad which extends from the data line,
wherein
the protecting layer overlaps the signal pad, and a third hole which exposes the signal pad is further defined in the protecting layer, and
the organic layer overlaps a side surface of the protecting layer which defines the third hole, and a fourth hole which exposes the signal pad is further defined in the organic layer.

8. The display substrate of claim 6, wherein a width of the second hole is smaller than a width of the first hole.

* * * * *